(12) United States Patent
Kimura

(10) Patent No.: US 7,768,329 B2
(45) Date of Patent: *Aug. 3, 2010

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/211,187

(22) Filed: Sep. 16, 2008

(65) Prior Publication Data

US 2009/0027370 A1    Jan. 29, 2009

Related U.S. Application Data

(63) Continuation of application No. 11/117,435, filed on Apr. 29, 2005, now Pat. No. 7,427,884.

(30) Foreign Application Priority Data

May 21, 2004    (JP) .............................. 2004-151722

(51) Int. Cl.
*H03K 3/00* (2006.01)
(52) U.S. Cl. ...................................... 327/199; 327/211
(58) Field of Classification Search ........................ None
See application file for complete search history.

(56) References Cited

U.S. PATENT DOCUMENTS

| | | | |
|---|---|---|---|
| 5,377,248 A | 12/1994 | Brooks | |
| 5,781,171 A | 7/1998 | Kihara | |
| 6,211,711 B1 * | 4/2001 | Laurier et al. | 327/199 |
| 6,304,122 B1 * | 10/2001 | Gregor et al. | 327/202 |
| 6,996,203 B2 | 2/2006 | Onda | |
| 7,427,884 B2 * | 9/2008 | Kimura | 327/199 |
| 2003/0234761 A1 | 12/2003 | Washio | |
| 2004/0108989 A1 | 6/2004 | Gyouten | |

FOREIGN PATENT DOCUMENTS

JP    2001-075543    3/2001

* cited by examiner

*Primary Examiner*—Lincoln Donovan
*Assistant Examiner*—Khareem E. Almo
(74) *Attorney, Agent, or Firm*—Fish & Richardson P.C.

(57) ABSTRACT

A shift register capable of supplying only a necessary clock signal to a necessary unit register with simple constitution. A semiconductor device is provided with a shift register in which a plurality of stages of unit registers is connected, in which the unit register comprises a flip-flop circuit, a first switch and a second switch, a first clock signal line is electrically connected to the flip-flop circuit through the first switch, a second clock signal line is electrically connected to the flip-flop circuit through the second switch, the first switch is controlled to be on/off by an output signal from the flip-flop circuit, and the second switch is controlled to be on/off by an input signal to the flip-flop circuit.

21 Claims, 23 Drawing Sheets

SEMICONDUCTOR DEVICE

CROSS-REFERENCE TO RELATED APPLICATIONS

This application is a continuation of U.S. application Ser. No. 11/117,435, filed Apr. 29, 2005, now allowed, which claims the benefit of a foreign priority application filed in Japan as Serial No. 2004-151722 on May 21, 2004, all of which are incorporated by reference.

BACKGROUND OF THE INVENTION

1. Field of the Invention

The present invention relates to a shift register employing a transistor, and particularly, relates to a shift register for controlling a display device.

2. Description of the Related Art

In display devices employing light emitting elements of a self-luminous type typified by an organic light emitting diode (OLED which is also called an organic EL element, an electroluminescence element, or the like) and liquid crystal display devices, a circuit for driving pixels is formed over the same substrate as the pixels. In such a circuit, a signal to sequentially select a plurality of wirings, a plurality of circuits (e.g., switches), or the like is required to be generated, therefore, a shift register is employed in many cases.

A shift register is generally supplied with clock signals, and operates in synchronization with the clock signals. However, the clock signal is supplied to all unit registers constituting the shift register, so that a large load is applied to a wiring for supplying the clock signal, which results in large power consumption.

It is to be noted here that a unit register corresponds to circuits for one stage or several stages in a shift register. A plurality of the unit registers are connected in series to constitute a shift register.

A technology has been proposed in which a clock signal is selectively supplied only to the unit register at the stage whose data is a level of significance (e.g., an H signal in the case of the positive logic). (e.g., see Patent Document 1)
[Patent Document 1] Japanese Patent No. 3326691

FIG. 19 is a circuit diagram of a unit register described in Patent Document 1. An input signal and an output signal of a delay flip-flop circuit (DFF) are inputted into a NOR circuit 1903. In the case where both of the input signal and the output signal are L signals, a transfer gate (also called an analog switch) 1901 and a transfer gate 1902 are both turned OFF simultaneously so that clock signals CLK1 and CLK2 are not supplied to the DFF. In the case where at least one of the input signal and the output signal is an H signal, the transfer gate 1901 and the transfer gate 1902 are both turned ON simultaneously so that the clock signals CLK1 and CLK2 are provided to the DFF.

Note that a specific circuit diagram of the DFF is shown in FIG. 20.

Next, another circuit described in Patent Document 1 is shown in FIG. 21. In FIG. 21, a transfer gate 2101 and a transfer gate 2102 are respectively constituted only by transistors having one polarity. Accordingly, no NOR circuit is required unlike the circuit shown in FIG. 19. In the case where one of the input signal and the output signal of the DFF is an L signal, the transfer gate 2101 and the transfer gate 2102 are both turned OFF simultaneously. Furthermore, in the case where at least one of the input signal and the output signal of the DFF is an H signal, the transfer gate 2101 and the transfer gate 2102 are both turned OFF simultaneously.

In the case of Patent Document 1, the transfer gates 1901 and 1902, and the transfer gates 2101 and 2102 are respectively turned ON simultaneously, so that a clock signal supply is controlled simultaneously. Consequently, a large load is applied to a wiring for supplying the clock signal, which results in large power consumption.

Furthermore, the circuit shown in FIG. 19 where the NOR circuit 1903 is provided is complex. On the other hand, no NOR circuit is provided in FIG. 21. However, in the circuit shown in FIG. 21, voltage is decreased for threshold voltage in the transfer gates 2101 and 2102 as described in Patent Document 1. Therefore, the amplitude of a clock signal is decreased to be supplied to the DFF. Accordingly, a transistor to turn OFF is not turned OFF, which leads to malfunction. In addition, current continues to flow in the transistor which is not turned OFF, so that power consumption is increased.

SUMMARY OF THE INVENTION

It is an object of the invention to provide a shift register capable of supplying only a necessary clock signal to a necessary unit register with simple constitution in view of the foregoing problem.

To achieve the aforementioned object, according to the invention, respective supplies of a first clock signal and a second signal to a flip-flop circuit are not controlled simultaneously, and a first clock signal and a second clock signal are controlled separately.

That is to say, in a unit register, only a first clock signal is supplied when only a first clock signal is required, only a second clock signal is supplied when only a second clock signal is required, both the signals are supplied when both the signals are required, and both the signals are not supplied when both the signals are not required.

Such operation is controlled by using an input signal and an output signal of the unit register.

The invention relates to a semiconductor device comprising a shift register in which a plurality of stages of unit registers is connected. The unit register includes a flip-flop circuit, a first switch and a second switch. A first clock signal line is electrically connected to the flip-flop circuit via the first switch, and a second clock signal line is electrically connected to the flip-flop circuit via the second switch. An input signal to the flip-flop circuit controls the first switch to be turned ON/OFF, and an output signal from the flip-flop circuit controls the second switch to be turned ON/OFF.

The invention relates to a semiconductor device comprising a shift register in which a plurality of stages of unit registers is connected. The unit register includes a flip-flop circuit, a first switch and a second switch. A first clock signal line is electrically connected to the flip-flop circuit via the first switch, and a second clock signal line is electrically connected to the flip-flop circuit via the second switch. The first switch is turned ON when an input signal to the flip-flop circuit is a level of significance, and the second switch is turned ON when an output signal from the flip-flop circuit is a level of significance.

In the invention, the first switch and the second switch are each constituted by a complementary transfer gate.

In the invention, any kind of transistor can be employed, including a thin film transistor (TFT) using a non-monocrystalline semiconductor film typified by amorphous silicon and polycrystalline silicon, a MOS transistor formed by using a semiconductor substrate or an SOI substrate, a junction transistor, a bipolar transistor, a transistor using an organic semiconductor or a carbon nanotube, and other transistors. In addition, the transistor may be disposed over any kind of substrate such as a monocrystalline substrate, an SOI substrate, a glass substrate, and a plastic substrate.

It is to be noted that in the invention, connection means electrical connection. Therefore, the constitution disclosed in the invention may additionally comprise other elements (such as an element or a switch) that enable electrical connection, between the predetermined connection.

As described above, the first clock signal CLK1 and the second clock signal CLK2 are controlled separately in the invention. Therefore, in the case where supply of one of the clock signals is not required, operation can be performed so as to stop the supply of the clock signal. Accordingly, the load on the wirings for supplying the first clock signal CLK1 and the second clock signal CLK2 is reduced. Reduction in the load on the clock signal line can lead to (a) normal operation of a circuit with the suppressed dullness of the waveform of a clock signal, (b) reduction in power consumption of an IC for supplying clock signals to a substrate over which transistors such as a shift register are formed (called an external IC hereinafter), (c) reduction in size and cost of the external IC with the current supply performance reduced, and the like.

In addition, since the constitution is simple, layout area of the circuit is reduced and the frame size can be reduced. Consequently, the number of panels taken from one mother glass can be increased. As a result, cost per panel is reduced so that price reduction can be realized.

Furthermore, the following problem does not occur: voltage is decreased for threshold voltage, the amplitude of a clock signal is decreased to be supplied to a flip-flop circuit, and a transistor to turn OFF is not turned OFF, so that malfunction occurs.

In this manner, according to the invention, reduction in cost and size can be realized, and a circuit can operate normally in more cases.

DETAILED DESCRIPTION OF THE INVENTION

Embodiment Mode 1

Figure 1:
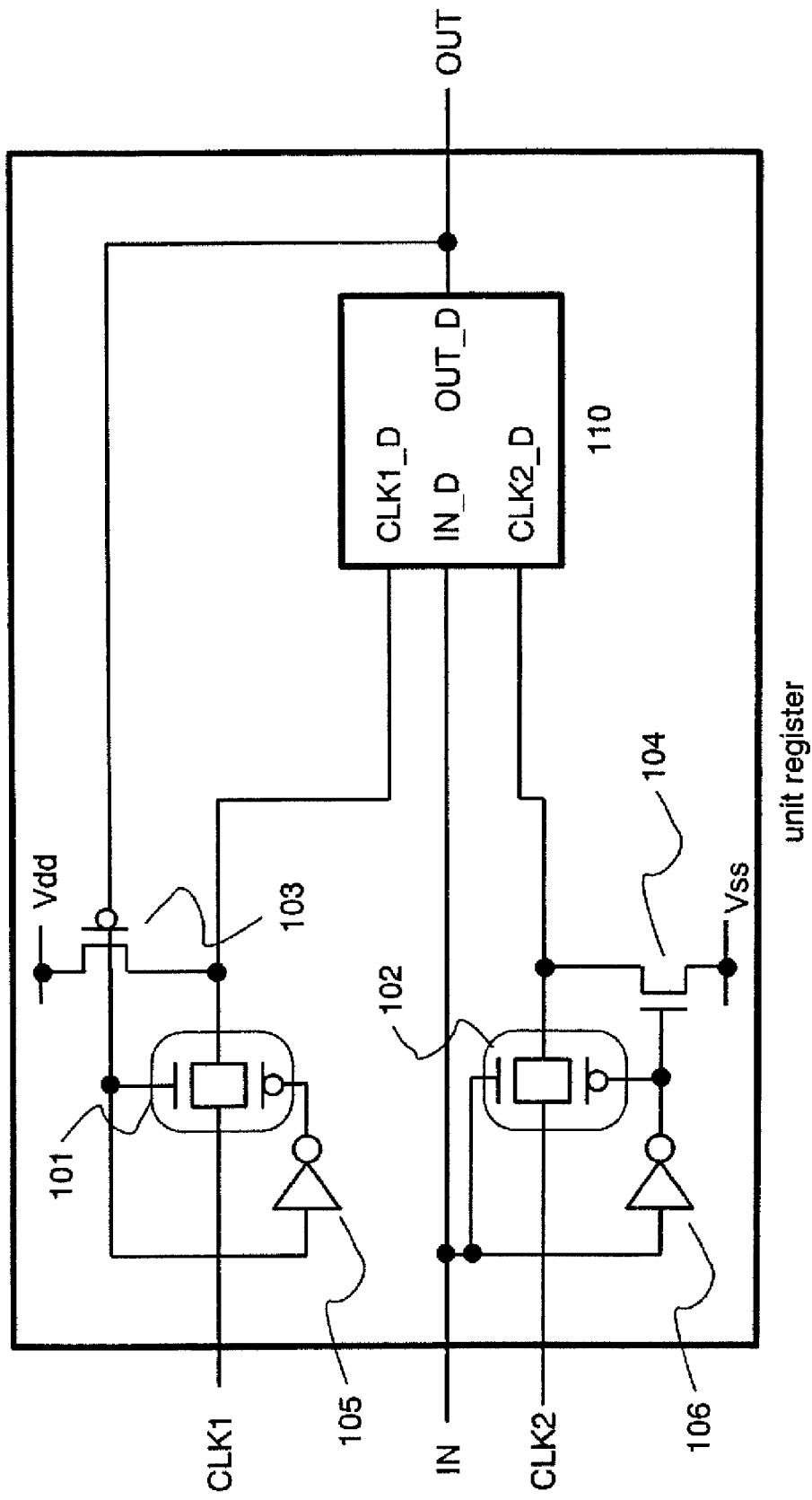
FIG. 1 is a diagram describing constitution of the semiconductor device of the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. It is to be noted that the same portion is denoted by the same reference numeral in different drawings in the structure of the invention described below.

FIG. 1 shows exemplary constitution of one stage of a shift register. It is to be noted here that one or several stages of a shift register are called a unit register. A unit register is constituted by switches 101 and 102, transistors 103 and 104, inverters 105 and 106, and a flip-flop circuit 110. One of gate electrodes of the switch 101 is connected to a gate electrode of the transistor 103 and the input side of the inverter 105, while the other is connected to the output side of the inverter 105. One of the source region and the drain region of the switch 101 is supplied with a first clock signal CLK1, while the other is connected to the source region or the drain region of the transistor 103, and a wiring CLK1_D. One of gate electrodes of the switch 102 is connected to the gate electrode of the transistor 104 and the output side of the inverter 106, while the other is connected to the input side of the inverter 106 and supplied with an input signal IN. One of the source region and the drain region of the switch 102 is supplied with a second clock signal CLK2, while the other is connected to the source region or the drain region of the transistor 104, and a wiring CLK2_D. The source region or the drain region of the transistor 103 to which the source region or the drain region of the switch 101 is not connected is connected to a high potential power source (Vdd). The source region or the drain region of the transistor 104 to which the source region or the drain region of the switch 102 is not connected is connected to a low potential power source (Vss).

Supply of the two clock signals to the flip-flop circuit is controlled by using the switches 101 and 102. The switch 101 controls supply of the first clock signal CLK1 to the flip-flop circuit 110, which is controlled by using an output signal from the flip-flop circuit 110. The switch 102 controls supply of the second clock signal CLK2 to the flip-flop circuit 110, which is controlled by using an input signal to the flip-flop circuit 110.

In this manner, the first clock signal CLK1 and the second clock signal CLK2 are controlled separately. Therefore, in the case where supply of one of the clock signals is not required, operation can be performed so as to stop the supply of the clock signal. Accordingly, the load on the wirings for supplying the first clock signal CLK1 and the second clock signal CLK2 is reduced. Reduction in the load on the clock signal line can lead to (a) normal operation of a circuit with the suppressed dullness of the waveform of a clock signal, (b) reduction in power consumption of an external IC for supplying clock signals to a substrate over which a shift register is formed, (c) reduction in size and cost of the external IC with the current supply performance reduced, and the like.

It is to be noted that a substrate over which transistors such as a shift resistor are formed and an external IC are provided on a board, where they are connected by COG (Chip On Glass), TAB (Tape Automated Bonding), or a printed circuit board. However, the invention is not limited to this. In addition, a circuit for supplying clock signals may be formed over the same substrate as the shift register.

Figure 2:
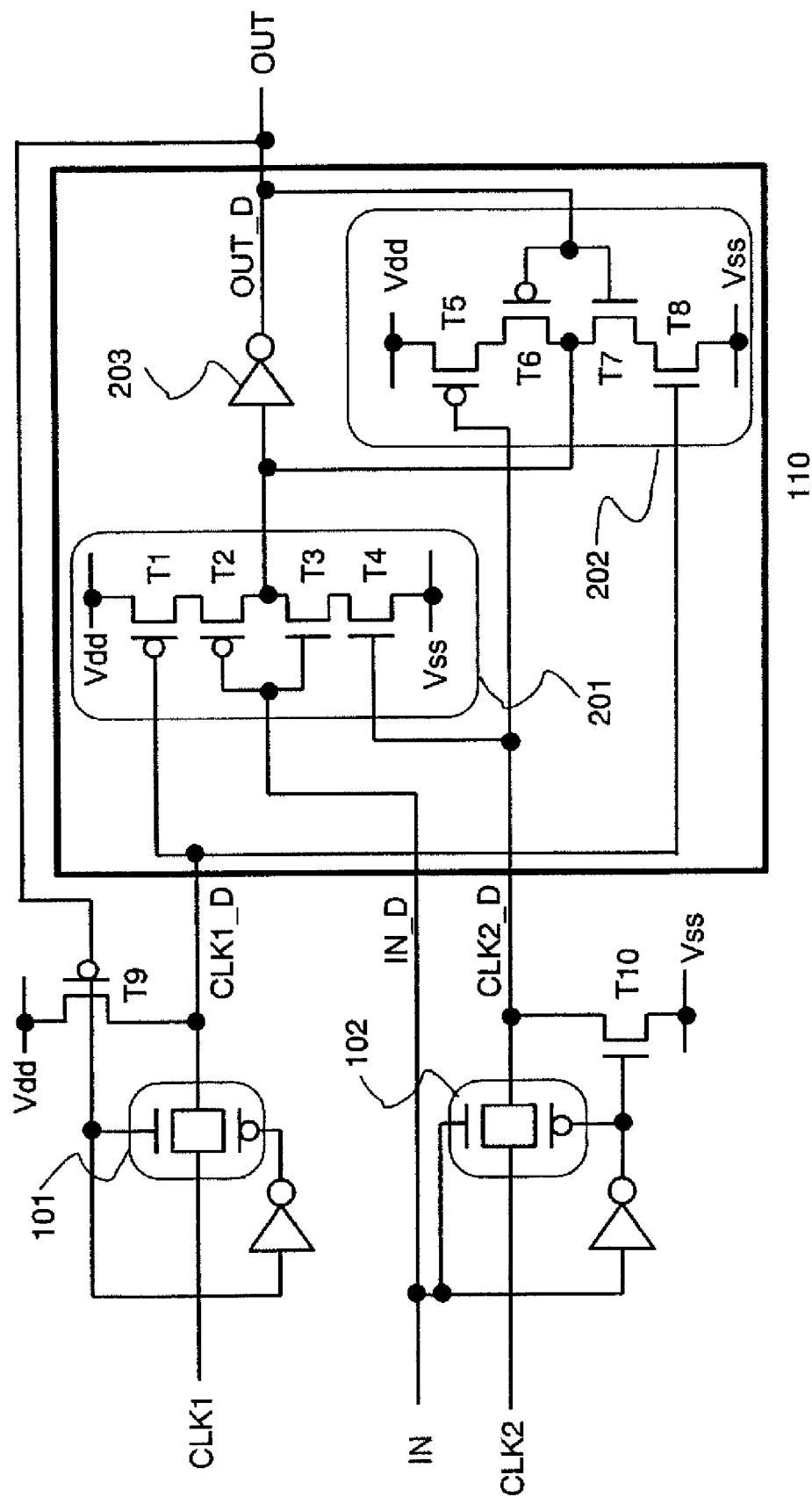
FIG. 2 is a diagram describing constitution of the semiconductor device of the invention.

FIG. 2 shows exemplary circuit constitution of the flip-flop circuit 110, which is constituted by a clocked inverter 201, an inverter 203 in the loop portion, and a clocked inverter 202. As for a clock input portion of the clocked inverter 201, the first clock signal CLK1 is connected to a P-channel transistor T1, and the second clock signal CLK2 is connected to an N-channel transistor T4. As for a clock input portion of the clocked inverter 202, the first clock signal CLK1 is connected to an N-channel transistor T8, and the second clock signal CLK2 is connected to a P-channel transistor T5. It is to be noted that constitution of the flip-flop circuit is not limited to that shown in FIG. 2.

Figure 3:
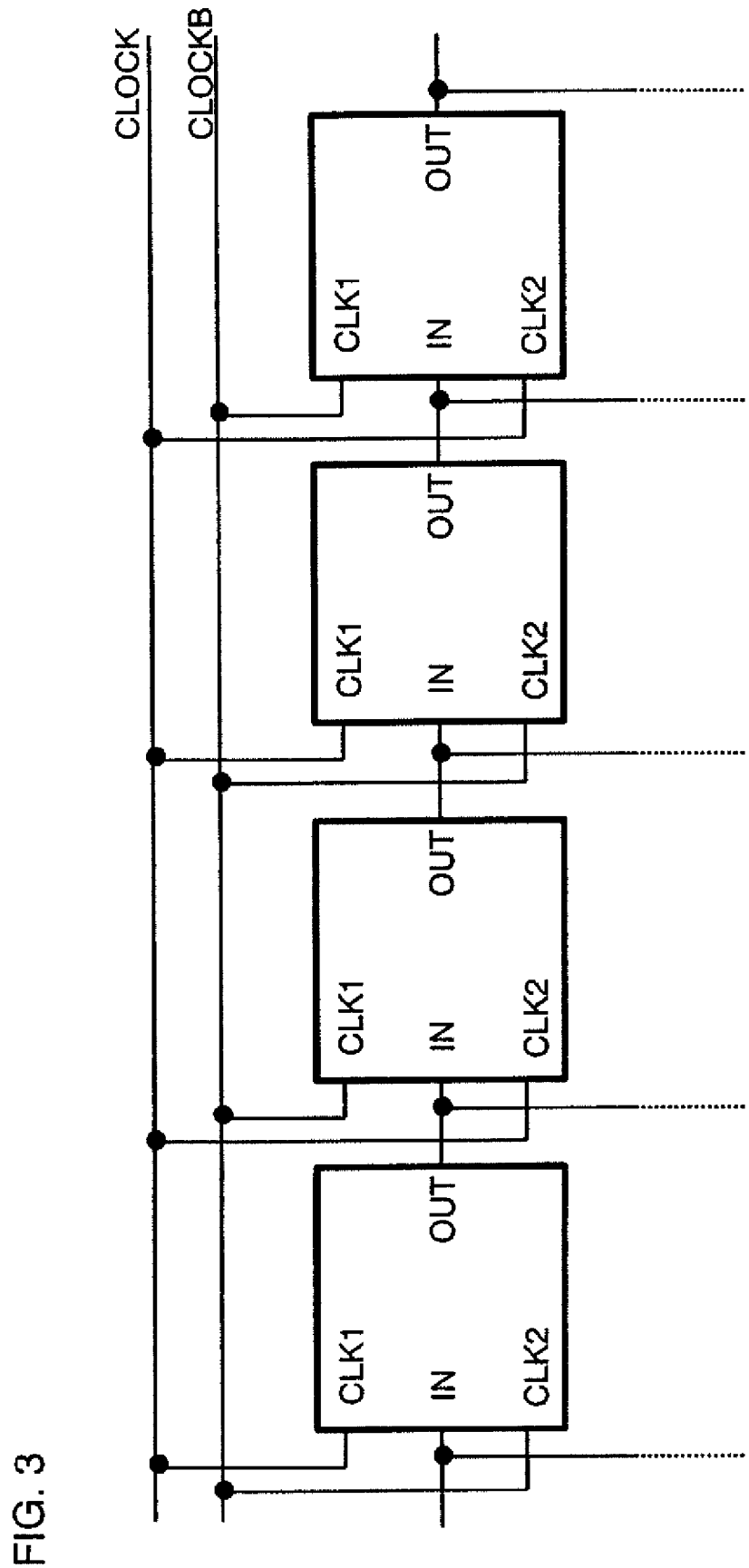
FIG. 3 is a diagram describing constitution of the semiconductor device of the invention.

A plurality of stages of such unit registers is connected to constitute one shift register. An overall diagram thereof is shown in FIG. 3. The first clock signal CLK1 and the second clock signal CLK2 of each unit register are connected to a clock signal CLOCK and a clock-bar signal CLOCKB. It is to be noted that the connection is performed such that the clock signal CLOCK and the clock-bar signal CLOCKB are alternated with each other. Accordingly, signals can be shifted.

In addition, a signal for sequentially selecting a plurality of wirings, a plurality of circuits (e.g., switches), or the like can be generated using an output signal from each unit register.

Figure 4:
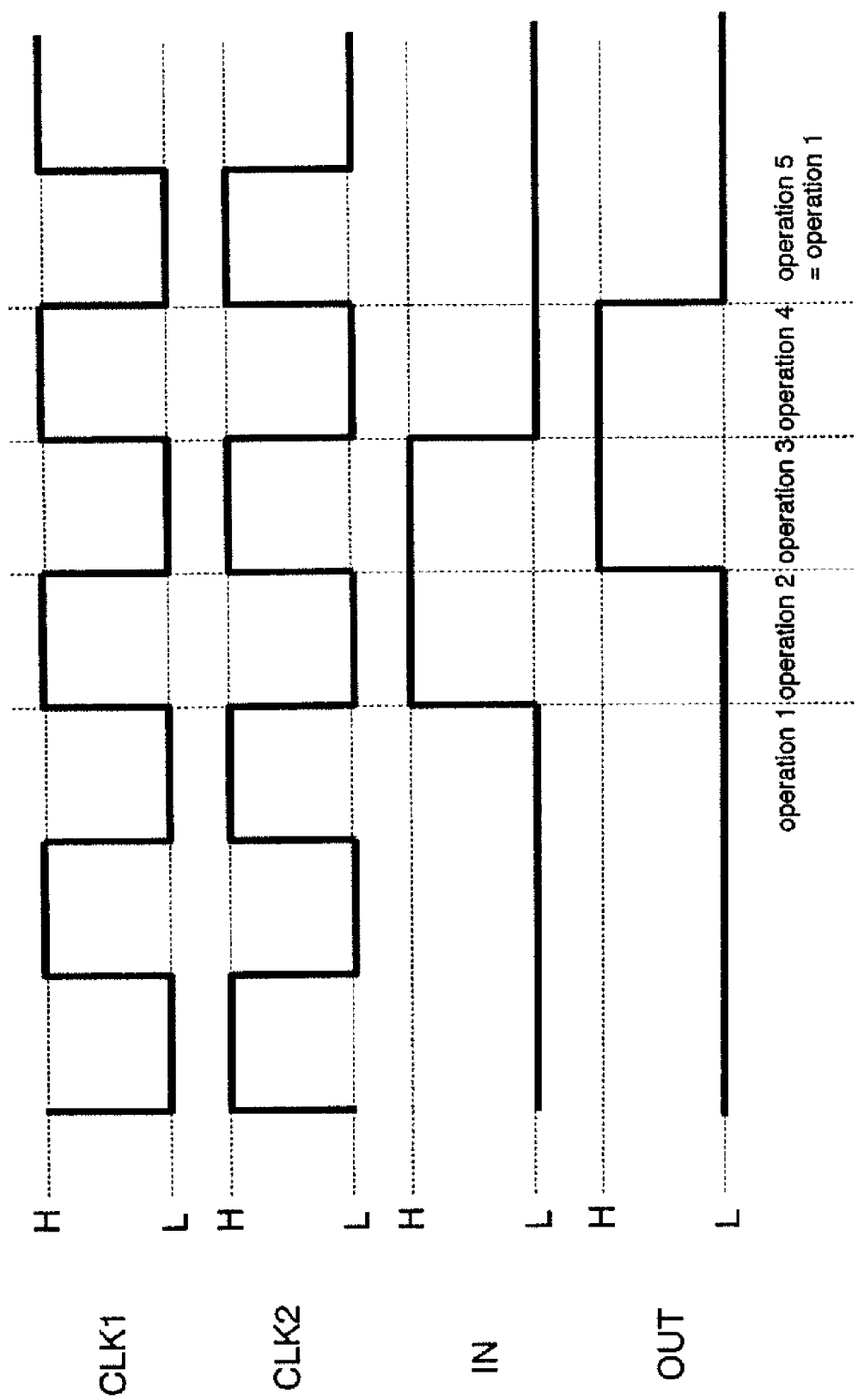
FIG. 4 is a diagram describing signal timing of the semiconductor device of the invention.

Next, operation is described. Operation of a unit register, that is not the whole shift register but one stage of the shift register, is described here. Waveforms of the first clock signal CLK1, the second clock signal CLK2, the input signal IN, and the output signal OUT are respectively shown in FIG. 4. As shown in FIG. 4, the operation is divided into five operation parts depending on respective operation states to describe.

Figure 5:
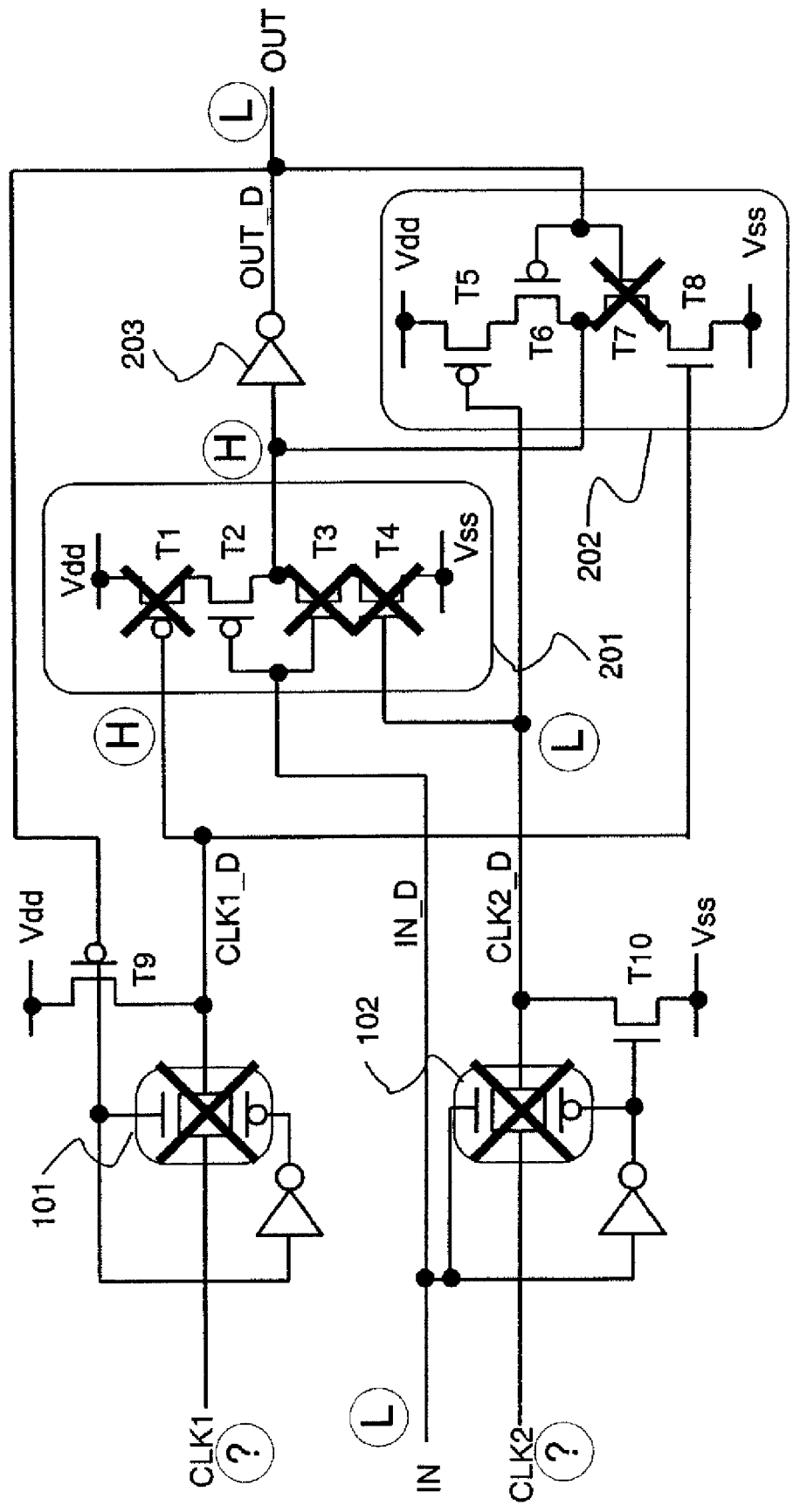
FIG. 5 is a diagram describing operation of the semiconductor device of the invention.

First, the case of operation 1 is illustrated in FIG. 5. As shown in FIG. 4, both of the input signal IN and the output signal OUT are L signals (corresponding to low signals, low voltage, a binary digit 0, or a level of non-significance in the case of the positive logic). Therefore, the switches 101 and 102 are turned OFF, and clock signals are not supplied to the circuit. Consequently, the load on the clock signal line is reduced. Meanwhile, the clocked inverter 201 outputs nothing (a floating state) and the inverter 203 in the loop portion and the clocked inverter 202 are required to hold data. In order to this, transistors T9 and T10 are required to be turned ON such that the wirings CLK1_D and CLK2_D are not in the floating state. Accordingly, transistors T1 and T4 are OFF, and the transistors T5 and T8 are ON. Note that, in FIG. 5, a reference symbol x at a transistor denotes the transistor in the OFF state. In addition, at each terminal, a reference symbol H denotes an H signal, L denotes an L signal, and ? denotes either an H signal or an L signal.

Figure 6:
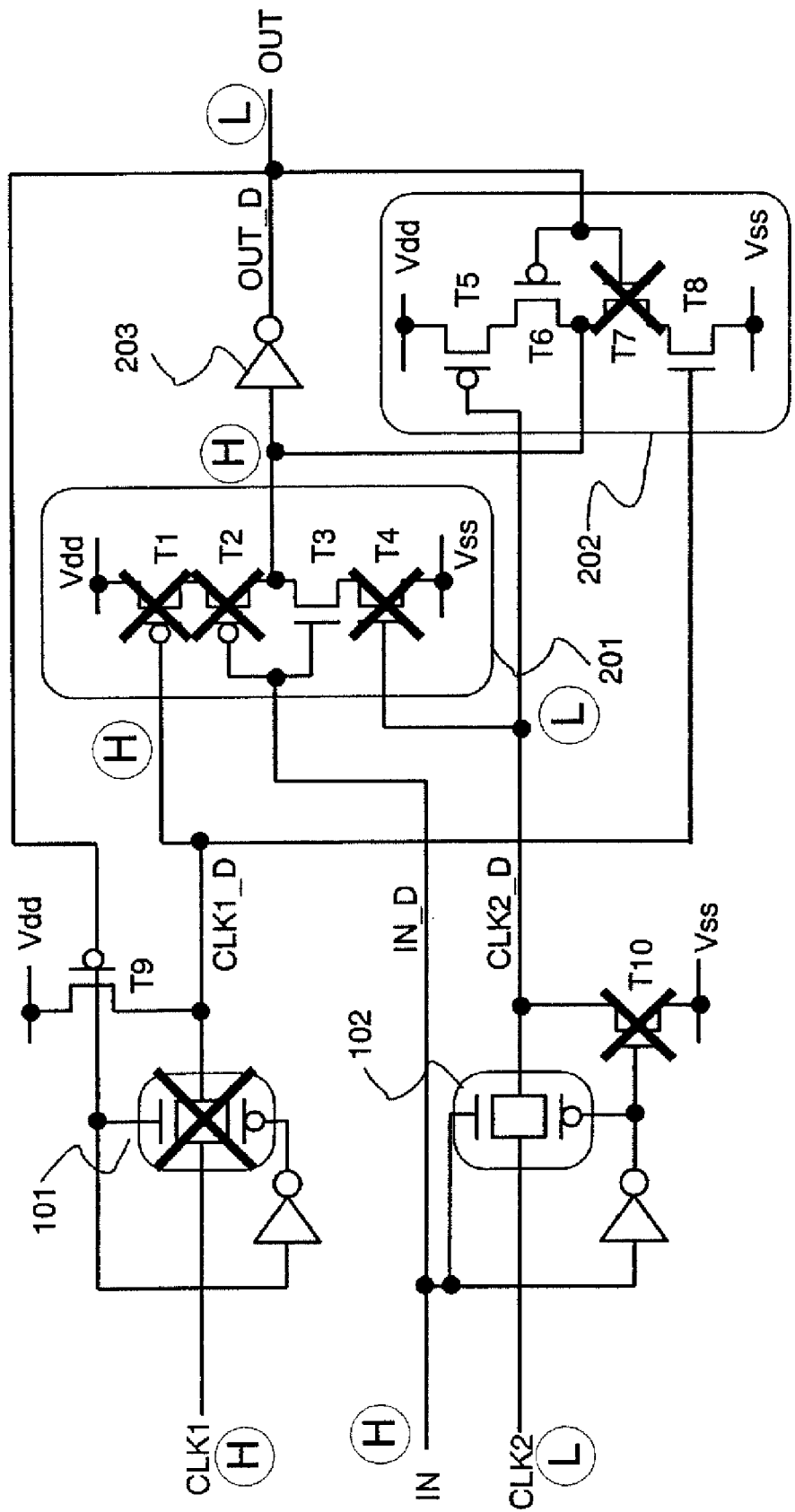
FIG. 6 is a diagram describing operation of the semiconductor device of the invention.

Next, the case of operation 2 is illustrated in FIG. 6. The input signal IN is an H signal (corresponding to a high signal, high voltage, a binary digit 1, or a level of significance in the case of the positive logic). Therefore, the switch 102 is turned ON, and the second clock signal CLK2 is supplied to the circuit. Meanwhile, the switch 101 remains OFF, and the first clock signal CLK1 is not supplied to the circuit. Consequently, the load on the signal line for supplying the first clock signal CLK1 remains to be reduced.

The transistor T10 is OFF, and the second clock signal CLK2 is supplied to the circuit. The second clock signal CLK2 is an L signal at this time, thus the transistor T4 remains OFF and the transistor T5 remains ON. Accordingly, the clocked inverter 201 outputs nothing (a floating state) and the inverter 203 in the loop portion and the clocked inverter 202 keep holding data.

Figure 7:
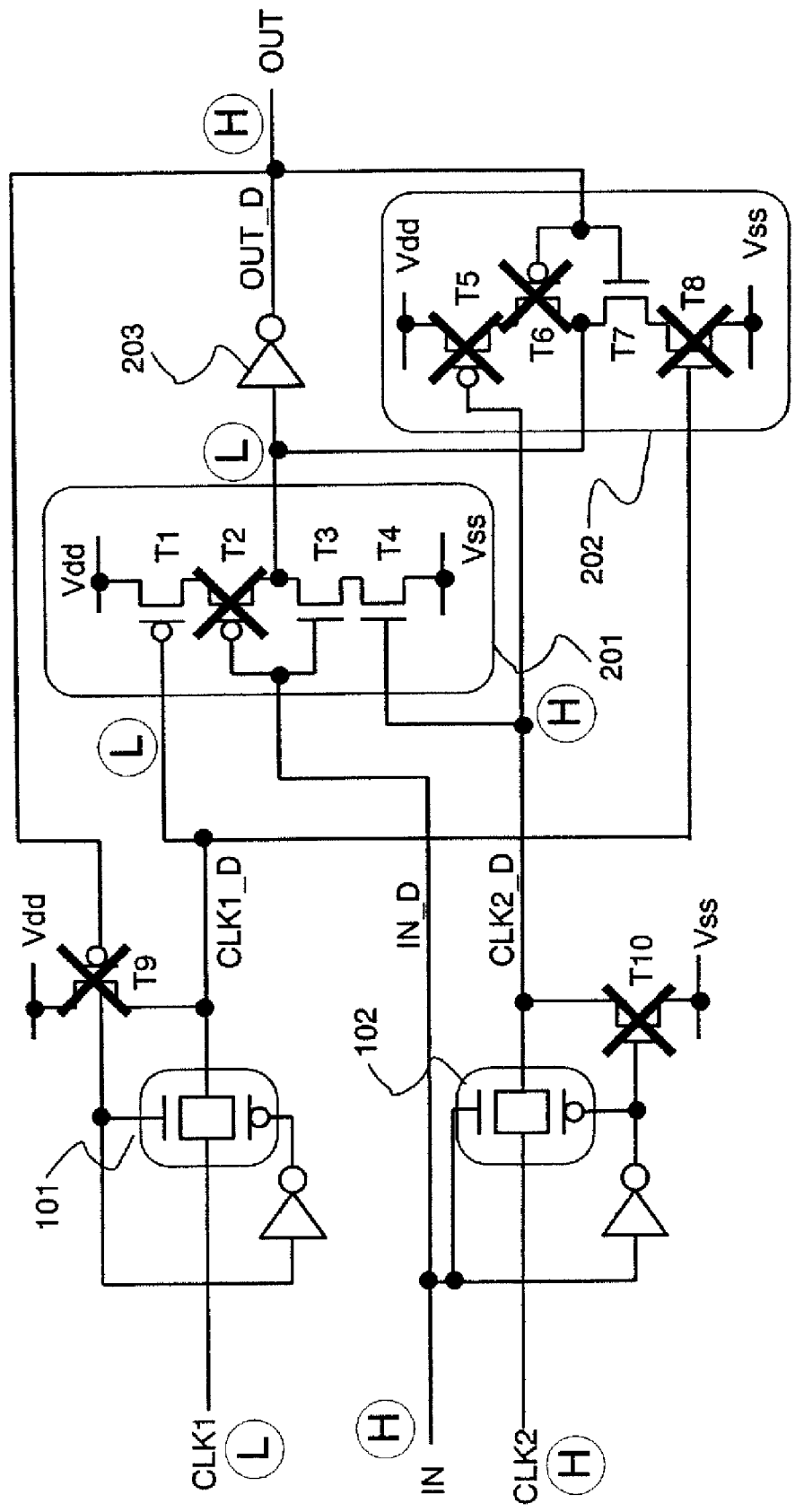
FIG. 7 is a diagram describing operation of the semiconductor device of the invention.

The case of operation 3 is illustrated in FIG. 7. The first clock signal CLK1 is an L signal and the second clock signal CLK2 is an H signal. Thus, the transistor T4 is turned ON and the transistor T5 is turned OFF. Meanwhile, since the input signal IN is an H signal, the transistor T3 is turned ON. Consequently, the clocked inverter 201 outputs an L signal. The L signal is inputted to the inverter 203, so that an H signal is outputted. Then, the switch 101 is turned ON while the transistor T9 is turned OFF, so that the first clock signal CLK1 is supplied to the circuit. Consequently, the transistor T1 is turned ON while the transistor T8 is turned OFF.

Figure 8:
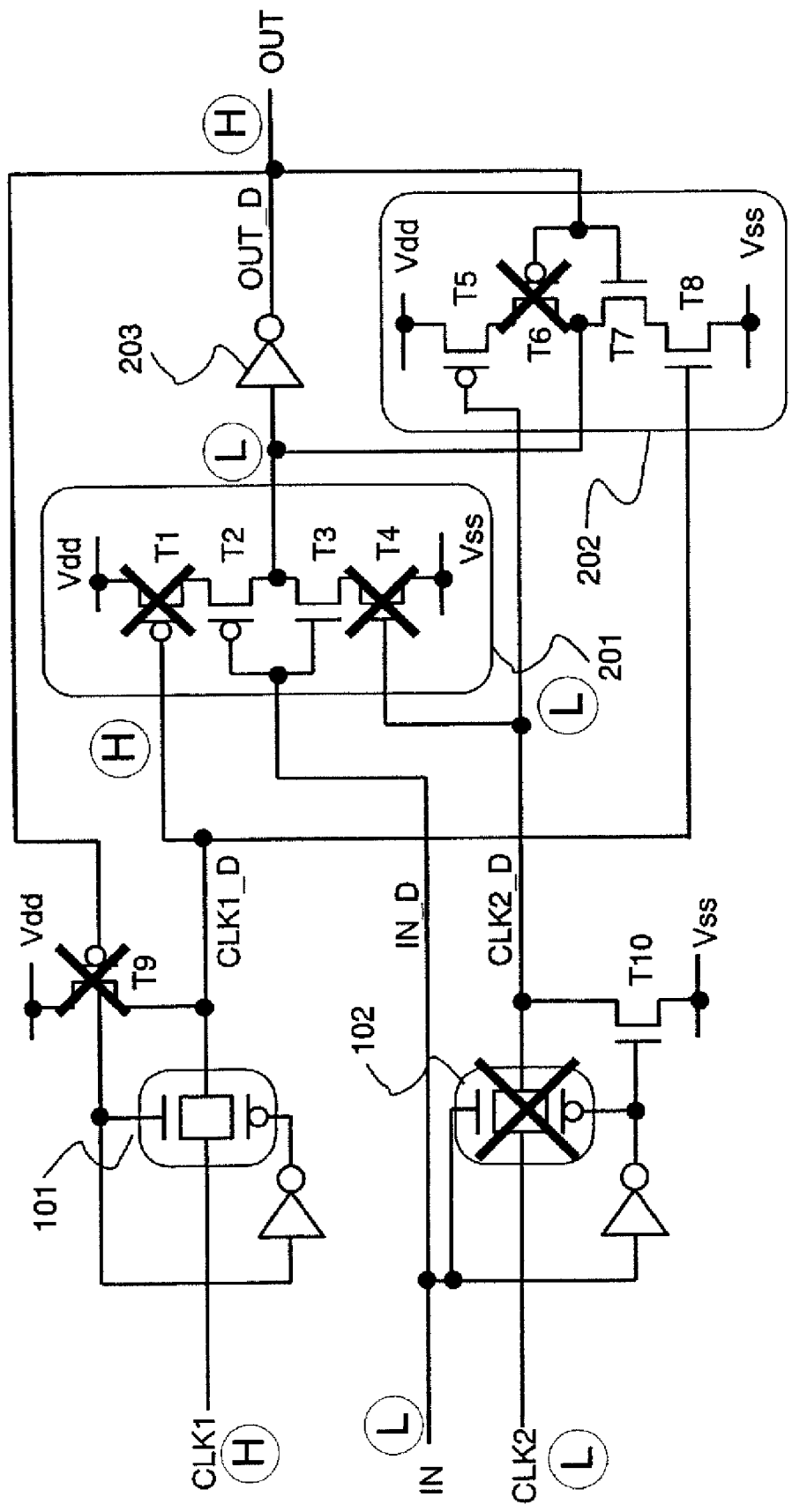
FIG. 8 is a diagram describing operation of the semiconductor device of the invention.

Subsequently, the case of operation 4 is illustrated in FIG. 8. The first clock signal CLK1 is an H signal and the second clock signal CLK2 is an L signal. Therefore, the switch 102 is turned OFF, and the second clock signal CLK2 is not supplied to the circuit. Accordingly, the load on the signal line for supplying the second clock signal CLK2 is reduced. Then, since the transistor T10 is turned ON, the wiring CLK2_D has an L signal to turn OFF the transistor T4 and turn ON the transistor T5. Meanwhile, the first clock signal CLK1 is supplied to the circuit, so that the transistor T1 is turned OFF while the transistor T8 is turned ON. Accordingly, the clocked inverter 201 outputs nothing (a floating state) and the inverter 203 in the loop portion and the clocked inverter 202 keep holding data.

Figure 9:
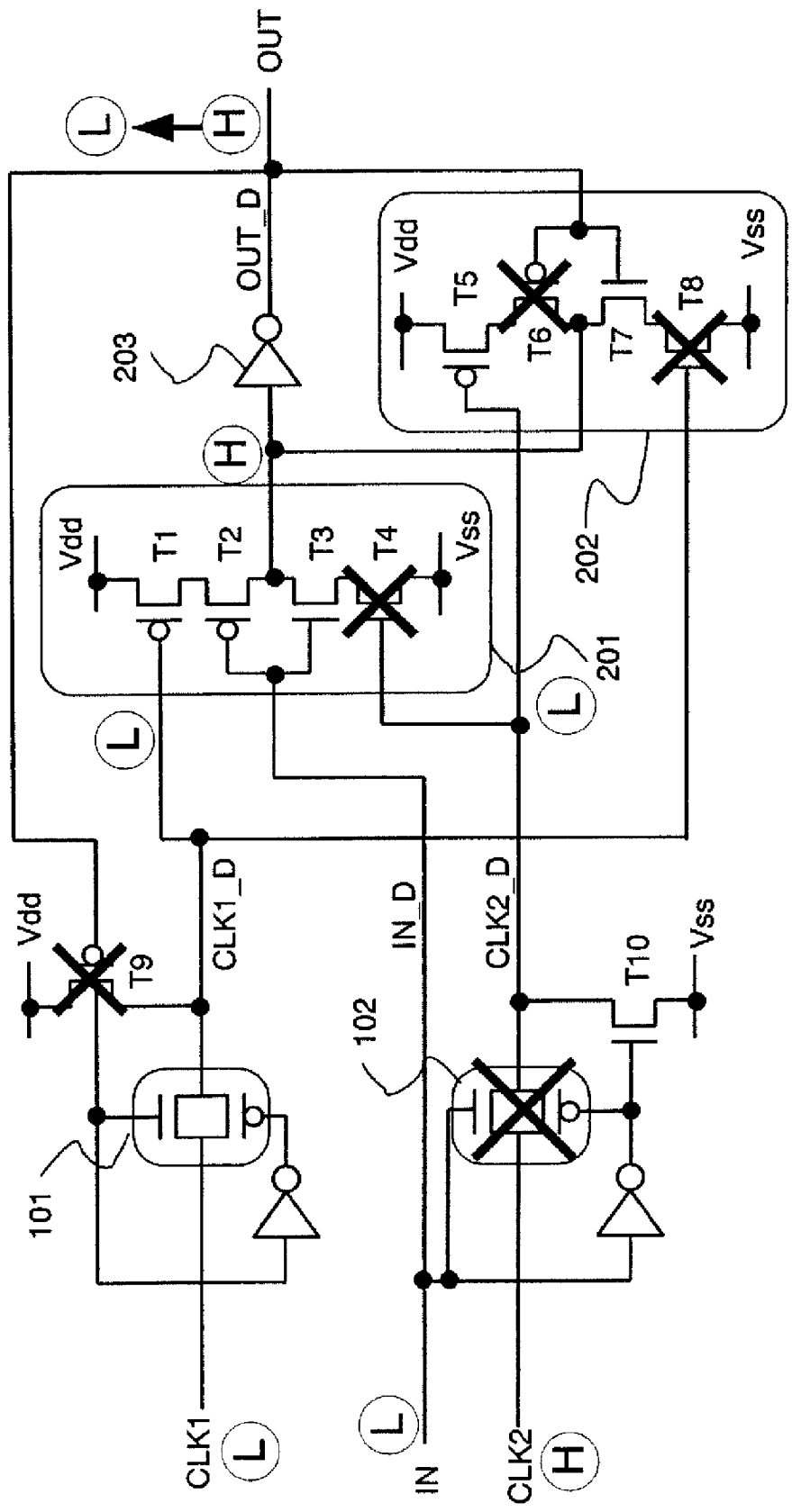
FIG. 9 is a diagram describing operation of the semiconductor device of the invention.

Next, the case of operation 5 is illustrated in FIG. 9. The first clock signal CLK1 is an L signal and the second clock signal CLK2 is an H signal. Since the switch 101 is ON at this time, the first clock signal CLK1 is supplied to the circuit. The transistor T1 is turned ON and the transistor T8 is turned OFF. Meanwhile, since the input signal IN is an L signal, the transistor T2 is turned ON. Consequently, the clocked inverter 201 outputs an H signal. The H signal is inputted to the inverter 203, so that an L signal is outputted as the output signal OUT as shown in FIG. 9.

Figure 10:
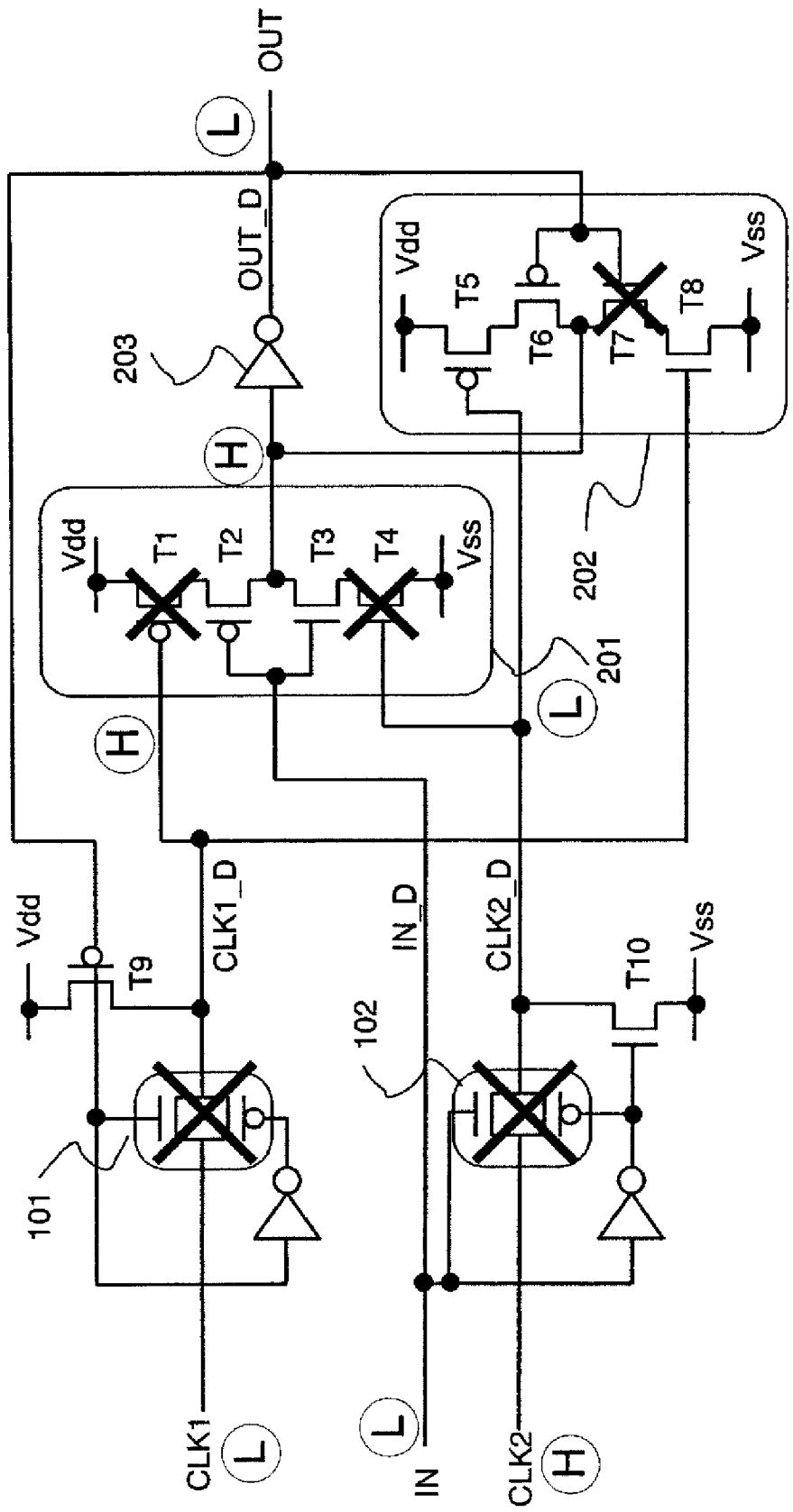
FIG. 10 is a diagram describing operation of the semiconductor device of the invention.

Accordingly, as shown in FIG. 10, the switch 101 is turned OFF while the transistor T9 is turned ON, so that the wiring CLK1_D has an H signal to turn OFF the transistor T1 and turn ON the transistor T8. Consequently, the clocked inverter 201 outputs nothing (a floating state) and the inverter 203 in the loop portion and the clocked inverter 202 keep holding data. In this manner, the switch 101 is turned OFF, so that the first clock signal CLK1 is not supplied to the circuit. Accordingly, the load on the signal line for supplying the first clock signal CLK1 is reduced.

In the above-described manner, the unit register can be operated. Since a shift register is constituted by connecting a plurality of stages of unit registers, description on the operation of the shift register is omitted herein.

It is to be noted that the unit register can be obtained as long as the circuit operates similarly as the above-described operation even if the connection is changed.

Figure 11:
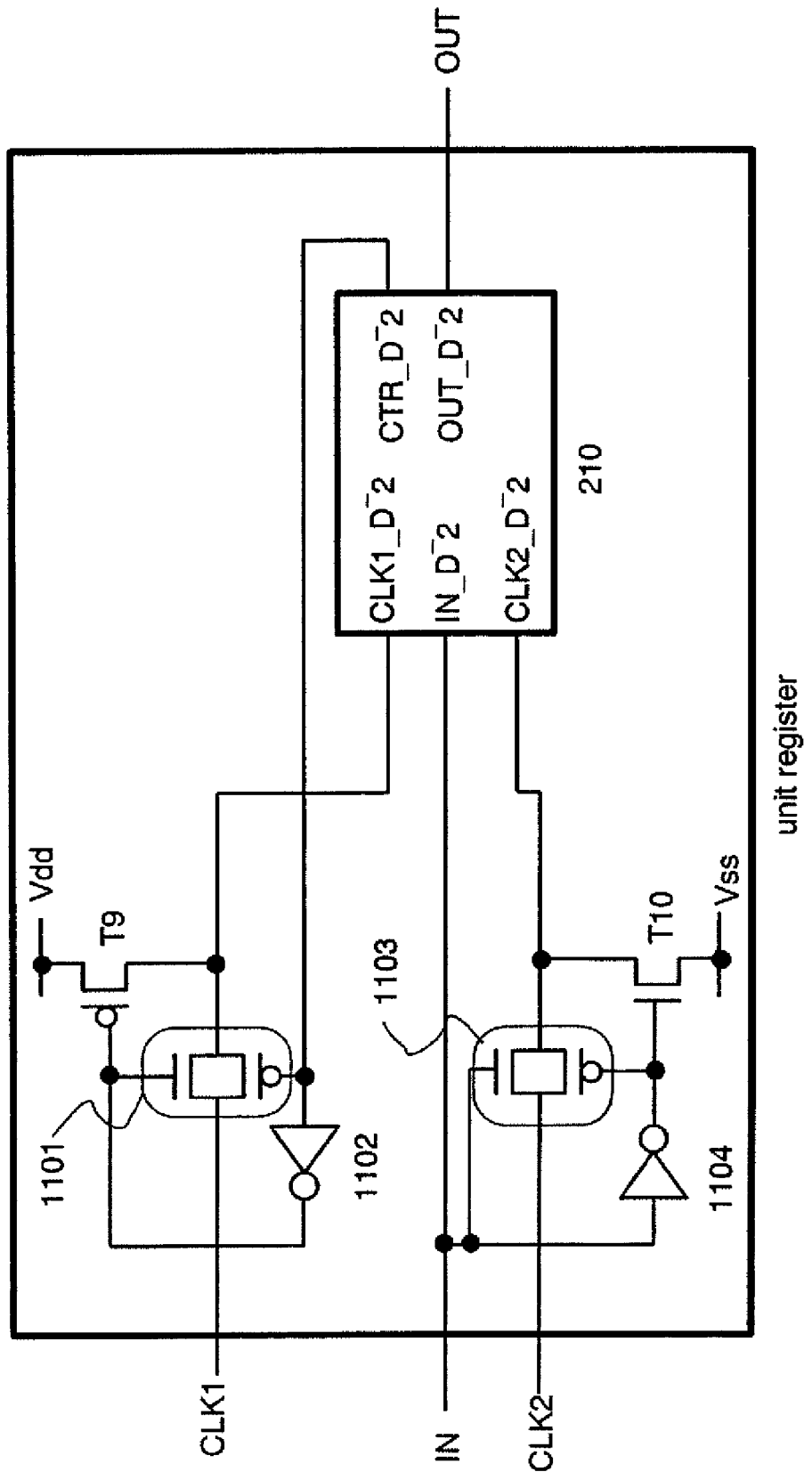
FIG. 11 is a diagram describing constitution of the semiconductor device of the invention.
Figure 12:
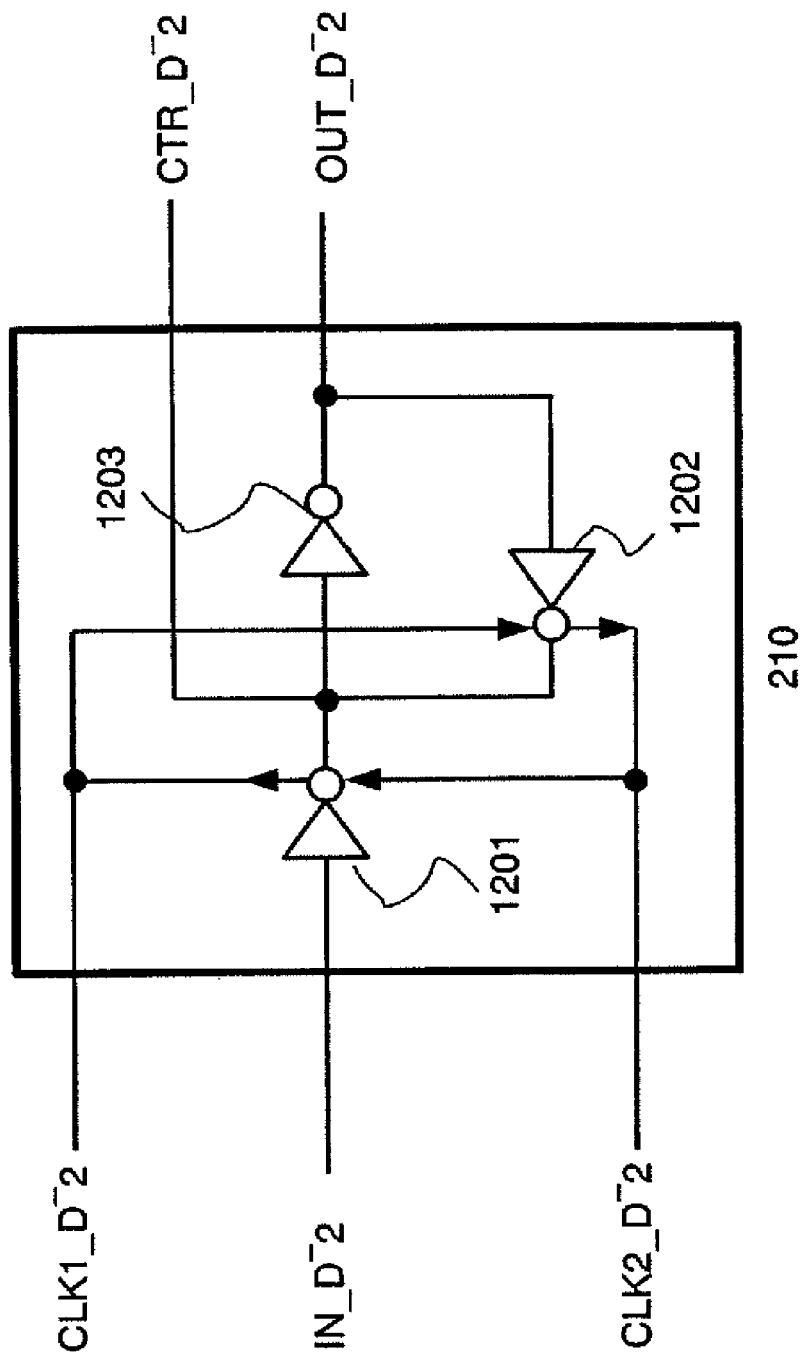
FIG. 12 is a diagram describing constitution of the semiconductor device of the invention.

For example, FIGS. 11 and 12 show the case where the connection constitution is changed. A unit register shown in FIG. 11 is constituted by switches 1101 and 1103, inverters 1102 and 1104, the transistors T9 and T10, and a flip-flop circuit 210. One of gate electrodes of the switch 1101 is connected to the transistor T9 and the output side of the inverter 1102, while the other is connected to the input side of the inverter 1102 and supplied with an input signal CTR_$\overline{D2}$ from the flip-flop circuit 210. One of the source region and the drain region of the switch 1101 is supplied with the first clock signal CLK1, while the other is connected to the source region or the drain region of the transistor T9, and a wiring CLK1_$\overline{D2}$. The source region or the drain region of the transistor T9 to which the wiring CLK1_$\overline{D2}$ is not connected is connected to a high potential power source (Vdd). One of gate electrodes of the switch 1103 is connected to the transistor T10 and the output side of the inverter 1104, while the other is supplied with the input signal IN and connected to the input side of the inverter 1104. One of the source region and the drain region of the switch 1103 is supplied with the second clock signal CLK2, while the other is connected to the source region or the drain region of the transistor T10, and a wiring CLK2_$\overline{D2}$. The source region or the drain region of the transistor T10 to which the wiring CLK2_$\overline{D2}$ is not connected is connected to a low potential power source (Vss).

FIG. 12 shows exemplary circuit constitution of the flip-flop circuit 210, which is constituted by clocked inverters 1201 and 1202, and an inverter 1203 in the loop portion. The clocked inverter 1201 is inputted with the first and second clock signals from the wirings CLK1_$\overline{D2}$ and CLK2_$\overline{D2}$ respectively. The clocked inverter 1202 is also inputted with the first and second clock signals from the wirings CLK1_$\overline{D2}$ and CLK2_$\overline{D2}$ respectively. The input side of the inverter 1203 in the loop portion is connected to the output sides of the clocked inverters 1201 and 1202, while the output side thereof is connected to the input side of the clocked inverter 1202 and outputted with an output signal OUT_$\overline{D2}$. It is to be noted that the constitution of the flip-flop circuit is not limited to that shown in FIG. 12.

As shown in FIG. 12, the switch 1101 shown in FIG. 11 is controlled by using an input signal CTR_$\overline{D2}$ to the inverter 1203. When comparing this case with FIG. 1, the signal for controlling the switch 1101 is inverted. Therefore, in accordance with this, the connection to the transistor T9 and the like are changed, and the connection is performed via the inverter 1102.

In addition, the transistors T9 and T10 are switched to be ON/OFF by using the input signal IN, the output signal OUT, or the like in FIGS. 1 and 11, however, the invention is not limited to this so long as the wirings CLK1_D and CLK2_D are prevented from being in the floating state.

Figure 13:
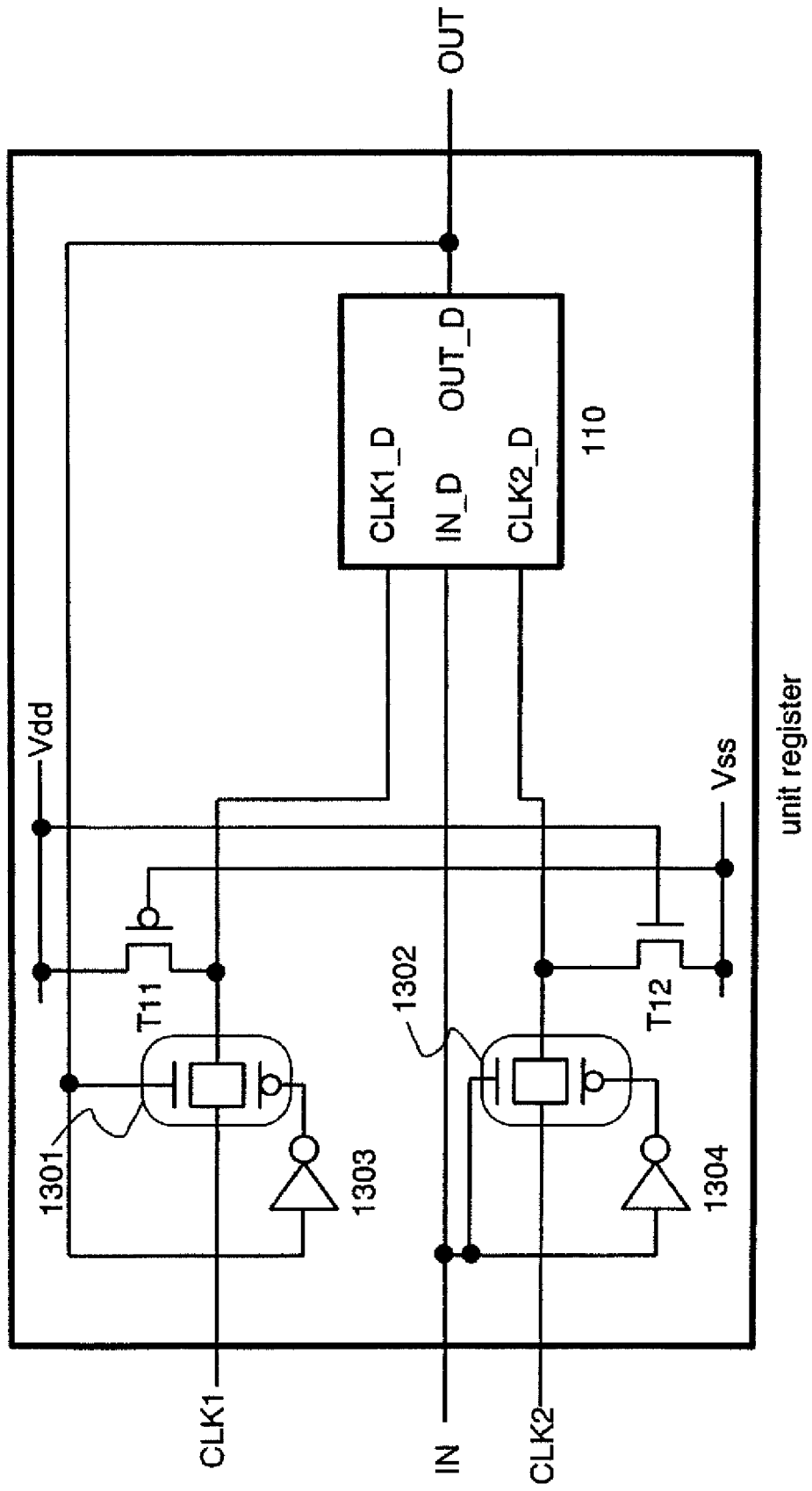
FIG. 13 is a diagram describing constitution of the semiconductor device of the invention.

FIG. 13 shows exemplary constitution which is different from FIGS. 1 and 11. A unit register shown in FIG. 13 is constituted by switches 1301 and 1302, inverters 1303 and 1304, transistors T11 and T12, and the flip-flop circuit 110. One of gate electrodes of the switch 1301 is connected to the output side of the inverter 1303, while the other is connected to the input side of the inverter 1303 and supplied with an output signal OUT_D from the flip-flop circuit 110. One of the source region and the drain region of the switch 1301 is supplied with the first clock signal CLK1, while the other is connected to the source region or the drain region of the transistor T11, and the wiring CLK1_D. One of gate electrodes of the switch 1302 is connected to the output side of the inverter 1304, while the other is connected to the input side of the inverter 1304 and supplied with the input signal IN. One of the source region and the drain region of the switch 1302 is supplied with the second clock signal CLK2, while the other is connected to the source region or the drain region of the transistor T12, and the wiring CLK2_D. The source region or the drain region of the transistor T11 to which the source region or the drain region of the switch 1301 is not connected is connected to a high potential power source (Vdd) and the gate electrode of the transistor T12. The source region or the drain region of the transistor T12 to which the source region or the drain region of the switch 1302 is not connected is connected to a low potential power source (Vss) and the gate electrode of the transistor T11.

Figure 14:
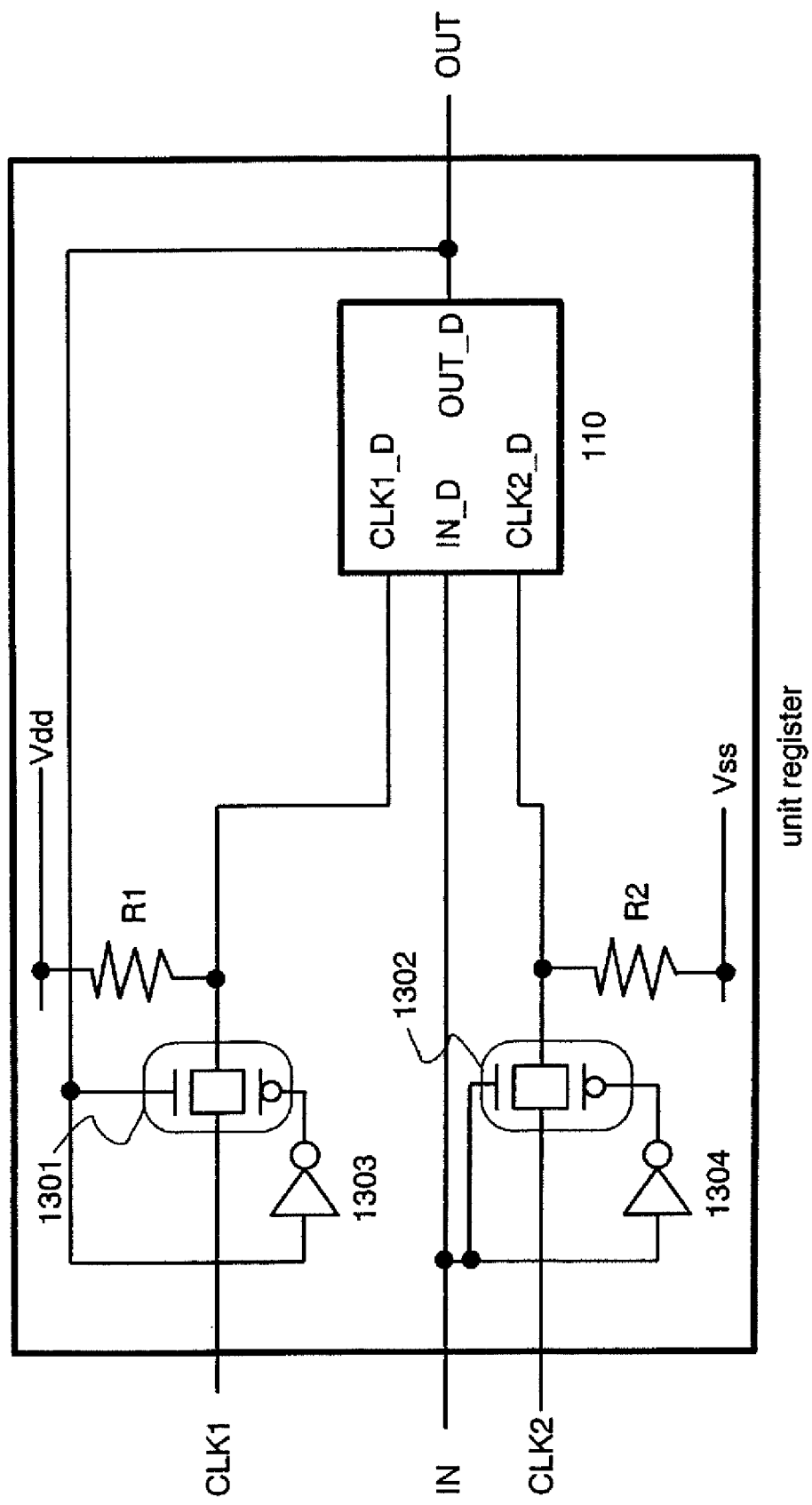
FIG. 14 is a diagram describing constitution of the semiconductor device of the invention.

In order to prevent the wirings CLK1_D and CLK2_D from being in the floating state, the transistors T11 and T12 which are always ON may be provided as shown in FIG. 13, or resistors R1 and R2 may be provided between the wirings CLK1_D and CLK2_D and the high potential power source (Vdd) or the low potential power source (Vss) respectively as shown in FIG. 14.

Figure 15:
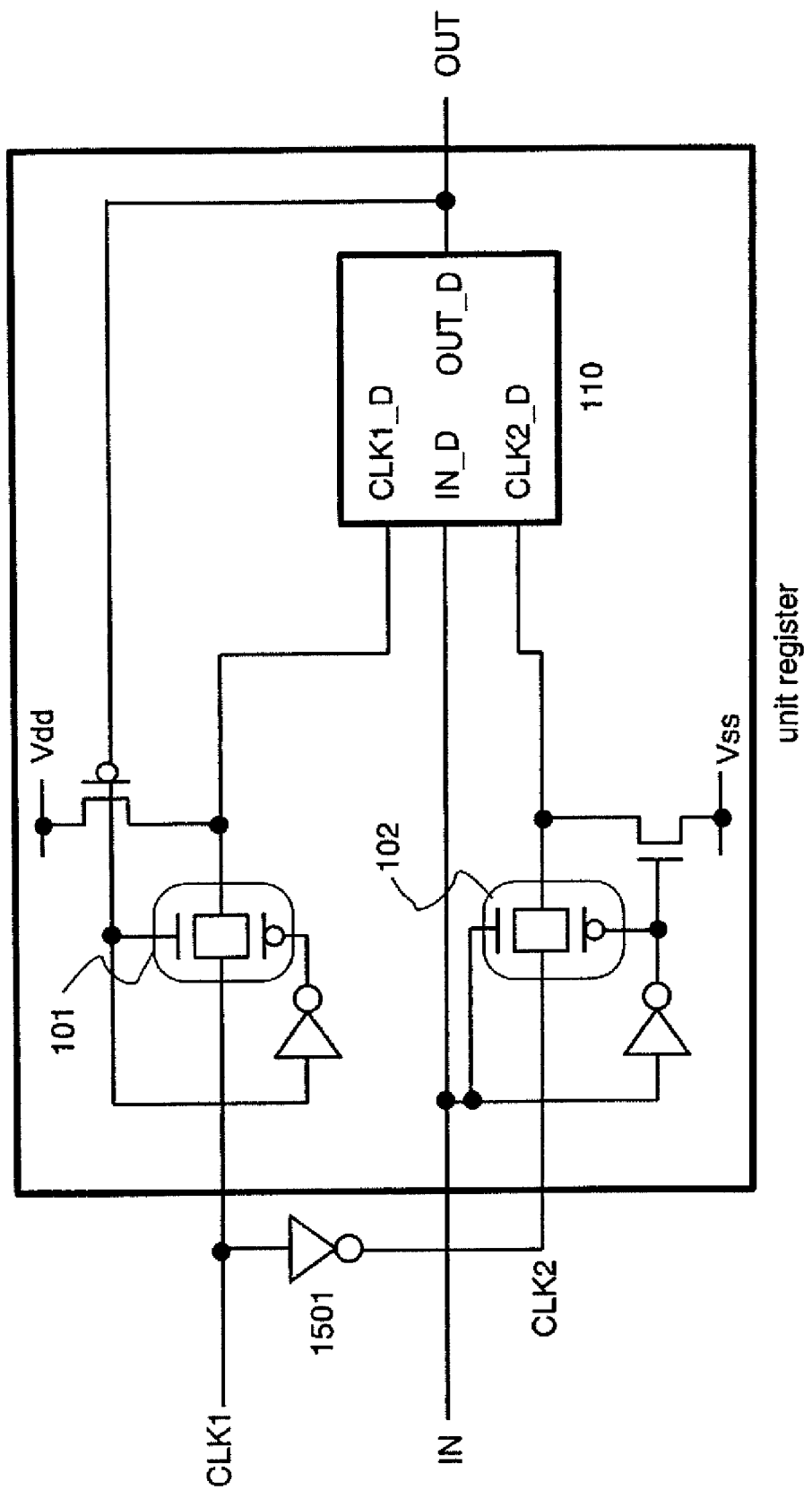
FIG. 15 is a diagram describing constitution of the semiconductor device of the invention.

In addition, two clock signal lines are provided in FIGS. 1 and 3, however, the invention is not limited to this. Alternatively, an inverted signal may be generated from one clock signal by using an inverter. In FIG. 15, the first clock signal CLK1 is supplied to a unit register as it is. Meanwhile, the first clock signal CLK1 is inputted to the inverter 1501 and then outputted from the inverter 1501, which is used as the second clock signal CLK2. Therefore, the second clock signal CLK2 is supplied to the unit register from the first clock signal CLK1 via the inverter 1501.

According to this, the number of clock signal lines can be reduced. By reducing the number of clock signal lines, an external IC for supplying signals to a substrate over which transistors such as a shift register are formed can be simply constituted. Furthermore, the number of signals to be inputted to the substrate over which transistors such as a shift register are formed from the external IC is decreased, so that the number of connections between the external IC and the substrate is decreased. The less number of connections decreases the possibility of a trouble at the connection portion (loose connection or the like), which leads to improve the reliability.

It is to be noted that the constitution adopts the positive logic to operate in this embodiment mode, however, the invention is not limited to this. The constitution may adopt the negative logic to operate by being arbitrarily changed. It will be easy for those skilled in the art to change the constitution.

It is to be noted that a delay flip-flop circuit (DFF) is employed as a flip-flop circuit in FIG. 2 and the like, however, the invention is not limited to this. Various types of flip-flop circuits may be employed, including an RS flip-flop circuit, a JK flip-flop circuit or a T flip-flop circuit.

It is to be noted that the switches 101 and 102 are CMOS transistors respectively in FIG. 1 and the like, however, the invention is not limited to this. Anything such as an electrical switch or a mechanical switch can be employed as long as current flow can be controlled, which may be a transistor, a diode, or a logic circuit constituted by combining such elements. In the case where a transistor is employed as the switch, therefore, the polarity (conductivity type) of the transistor is not particularly restricted since the transistor operates only as a switch. However, in the case where less off-current is preferable, a transistor having the polarity where off-current is small is preferably employed. As the transistor where off-current is small, transistors providing an LDD region, having a multi-gate structure, or the like are included. In addition, when the transistor whose potential at the source terminal is close to a low potential power source (e.g., Vss, Vgnd, and 0V) operates as a switch, an N-channel transistor is preferably employed. To the contrary, when the transistor whose potential at the source terminal is close to a high potential power source (e.g., Vdd) operates as a switch, a P-channel transistor is preferably employed. The reason is that a large absolute value of gate-source voltage can be obtained for easily operating as a switch. Note that a CMOS switch may be employed using both an N-channel transistor and a P-channel transistor.

Embodiment Mode 2

In this embodiment mode, constitution of a display device, a signal line driver circuit, a gate line driver circuit, or the like, and operation thereof are described. A circuit of the invention can be employed partially to the signal line driver circuit and the gate line driver circuit.

Figure 16:
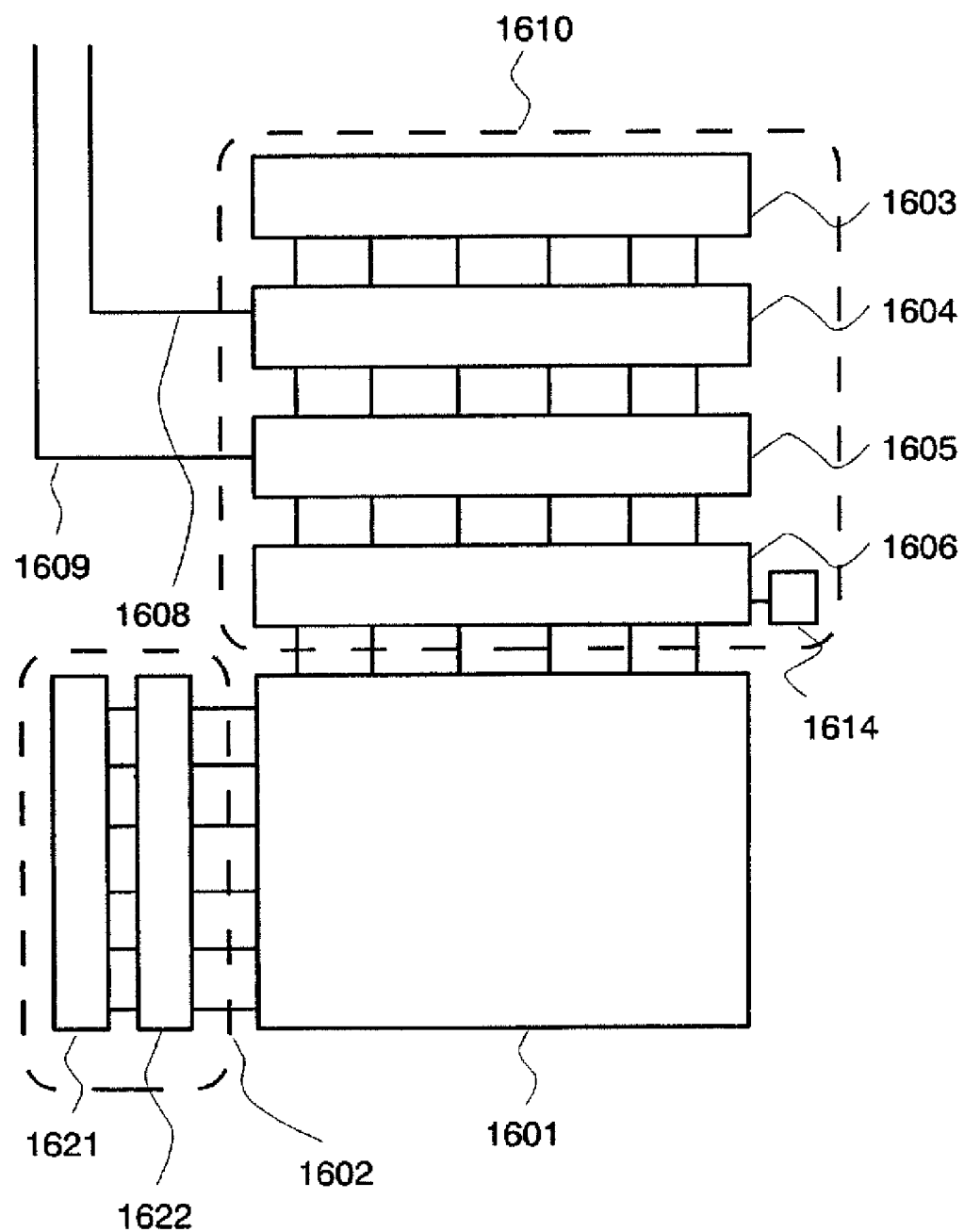
FIG. 16 is a diagram describing constitution of a display device to which the invention is applied.

A display device comprises a pixel array 1601, a gate line driver circuit 1602, and a signal line driver circuit 1610 as shown in FIG. 16. The gate line driver circuit 1602 outputs a selection signal sequentially to the pixel array 1601. The gate line driver circuit 1602 is constituted by a shift register 1621, a buffer circuit 1622, and the like.

Here, the circuit described in Embodiment Mode 1 which is shown in FIGS. 1 to 3 and FIGS. 11 to 15 for example is employed to the shift register 1621. Accordingly, the load on a wiring for supplying a clock signal is reduced and the dullness of the waveform of the clock signal is suppressed, which leads to normal operation of a circuit. In addition, power consumption can be reduced. In addition, since the constitution is simple, layout area of the circuit is reduced and the frame size can be reduced. Furthermore, power consumption of an external IC for supplying clock signals to a substrate over which transistors such as a shift register are formed can be reduced, which leads to reduction in size and cost of the external IC with the current supply performance reduced.

A level shifter circuit, a pulse width control circuit, and the like may be additionally provided in the gate line driver circuit 1602. The shift register 1621 outputs a pulse for selecting sequentially, to which the circuit described in Embodiment Mode 1 which is shown in FIGS. 1 to 3 and FIGS. 11 to 15 for example can be employed. The signal line driver circuit 1610 outputs a video signal sequentially to the pixel array 1601. A shift register 1603 outputs a pulse for selecting sequentially, to which the invention can be employed. In the pixel array 1601, the light condition is controlled in accordance with the video signal to display an image. The video signal inputted from the signal line driver circuit 1610 to the pixel array 1601 is current in many cases. That is, display elements each disposed in a pixel and elements for controlling the display elements are changed their states in accordance with the video signal (current) inputted from the signal line driver circuit 1610. As a display element disposed in the pixel, an EL element (Electroluminescence: EL which is also called an organic light emitting diode: OLED, an organic EL element, or the like), an element used in an FED (Field Emission Display), a liquid crystal element and the like are included.

It is to be noted that a plurality of the gate line driver circuits 1602 or a plurality of the signal line driver circuits 1610 may be provided.

Constitution of the signal line driver circuit 1610 can be divided into a plurality of portions. For example, it can be divided into a shift register 1603, a first latch circuit (LAT1) 1604, a second latch circuit (LAT2) 1605, and a digital-analog converter circuit 1606. The digital-analog converter circuit 1606 may have a function to convert voltage into current, and may have a function to perform a gamma correction as well. That is, the digital-analog converter circuit 1606 may have a circuit to output current (video signals) to pixels, namely a current source circuit.

A digital voltage signal for a video signal and current for controlling a current source circuit in a pixel are inputted to pixels in some cases depending on constitution of the pixel. In that case, the digital-analog converter circuit 1606 does not have a digital-analog converting function, but has a function to convert voltage into current and a current source circuit, that is a circuit for outputting the current to the pixels as current for controlling.

Further, the pixel includes a display element such as an EL element, and a current source circuit, that is a circuit for outputting current (video signals) to the display element.

Now, operation of the signal line driver circuit 1610 is described briefly. The shift register 1603 is inputted with a clock signal (S-CLK), a start pulse (SP), and an inverted clock signal (S-CLKb), and outputs a sampling pulse sequentially in accordance with these signal timings.

Here, the invention is employed to the shift register 1603. Accordingly, the load on a wiring for supplying the clock signal is reduced and the dullness of the waveform of the clock signal is suppressed, which leads to normal operation of a circuit. In addition, power consumption can be reduced. In addition, since the constitution is simple, layout area of the circuit is reduced and the frame size can be reduced. Furthermore, power consumption of an external IC for supplying clock signals to a substrate over which transistors such as the shift register are formed can be reduced, which leads to reduction in size and cost of the external IC with the current supply performance reduced.

The sampling pulse outputted from the shift register 1603 is inputted to the first latch circuit (LAT1) 1604. The first latch circuit (LAT1) 1604 is inputted with a video signal from a video signal line 1608 and holds the video signal in each column in accordance with the timing at which the sampling pulse is inputted. Note that a video signal is a digital value in the case where the digital-analog converter circuit 1606 is provided. The video signal at this stage is voltage in many cases.

In the case where the first latch circuit 1604 and the second latch circuit 1605 can store analog values, however, the digital-analog converter circuit 1606 can be omitted in many cases. In that case, the video signal is current in many cases. Moreover, in the case where data outputted to the pixel array 1601 have a binary value, namely a digital value, the digital-analog converter circuit 1606 can be omitted in many cases.

After the video signal holding is completed at the last column in the first latch circuit (LAT1) 1604, a latch pulse is inputted from a latch control line 1609 during a horizontal flyback period and the video signals held in the first latch circuit (LAT1) 1604 are transferred to the second latch circuit (LAT2) 1605 all at once. After that, the video signals held in the second latch circuit (LAT2) 1605 are inputted to the digital-analog converter circuit 1606, which is performed for one row at a time. The signal outputted from the digital-analog converter circuit 1606 is inputted to the pixel array 1601.

While the video signal held in the second latch circuit (LAT2) 1605 is inputted to the digital-analog converter circuit 1606 and to the pixel array 1601, a sampling pulse is outputted again from the shift register 1603. That is, two operations are performed at the same time, so that a line sequential drive can be performed. Subsequently, this operation is repeated.

In the case where the current source circuit in the digital-analog converter circuit 1606 is a circuit which performs the set operation and the output operation, that is a circuit which is inputted with current from a different current source circuit and can output current which is not affected by a variation in characteristics of a transistor, a circuit for flowing current to the current source circuit is required. In that case, a reference current source circuit 1614 is provided.

It is to be noted that the signal line driver circuit or a part thereof (e.g., a current source circuit and an amplifier circuit) may not be formed over the same substrate as the pixel array 1601. For example, they may be constituted by using an external IC chip.

It is to be noted that constitution of the signal line driver circuit, the gate line driver circuit, and the like are not limited to those shown in FIG. 16.

Figure 17:
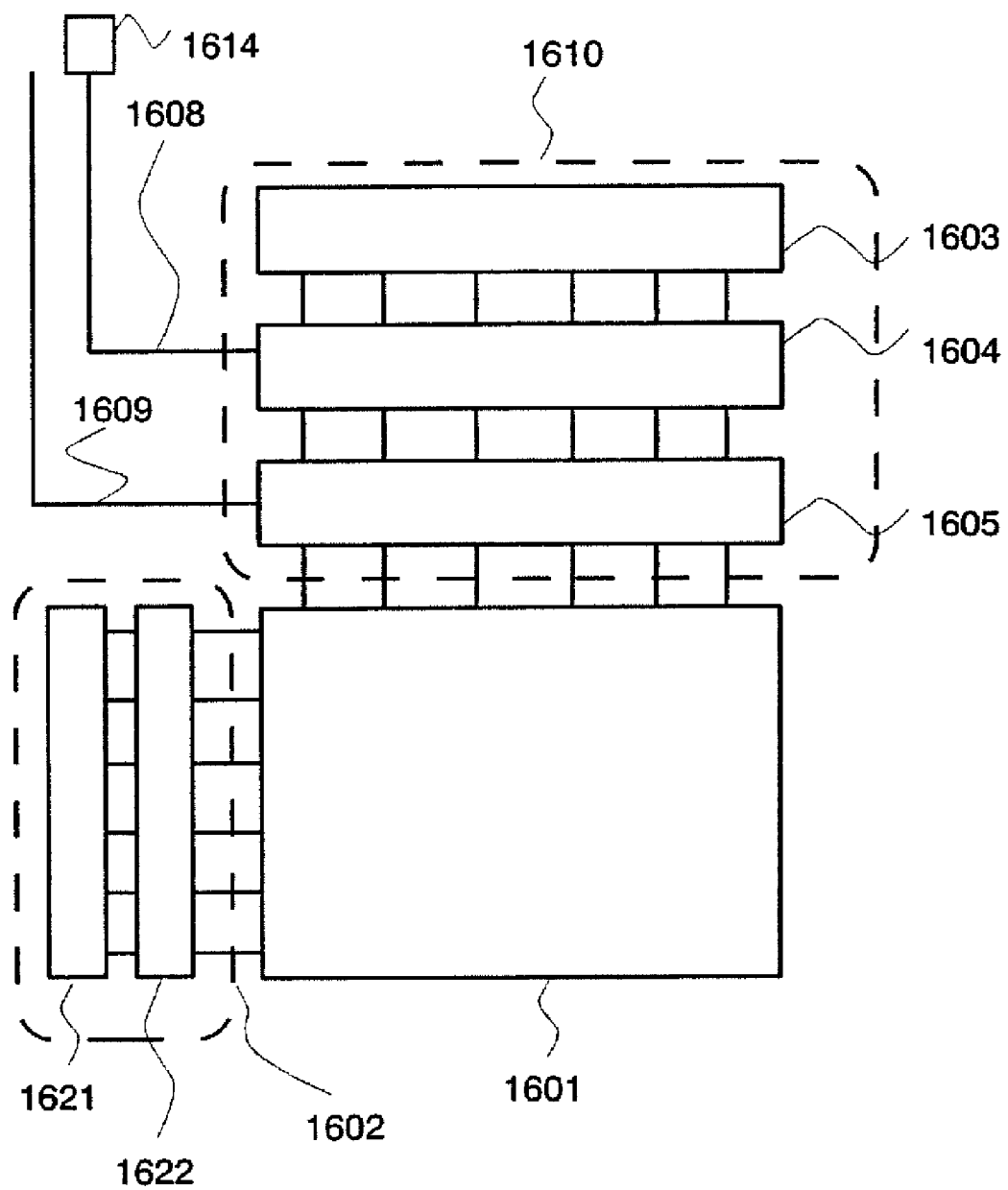
FIG. 17 is a diagram describing constitution of a display device to which the invention is applied.

For example, in the case where the first latch circuit 1604 and the second latch circuit 1605 can store analog values, a video signal (analog current) may be inputted from the reference current source circuit 1614 to the first latch circuit (LAT1) 1604 as shown in FIG. 17. Furthermore, the second latch circuit 1605 may not be provided in FIG. 17 in some cases. In that case, more current source circuits are often provided in the first latch circuit 1604. Alternatively, it may be constituted by a shift register and a sampling switch, and the like. In that case, a dot sequential drive is performed.

Note that, as described hereinbefore, any type of transistor can be used and the kind of a substrate over which the transistor is formed is not limited in the invention. Therefore, the circuits shown in FIGS. 16 and 17 can be formed over any kind of substrate, including a glass substrate, a plastic substrate, a monocrystalline substrate, and an SOI substrate. Furthermore, it is possible that a part of the circuit shown in FIG. 16 or 17 is formed over a substrate while the other part thereof is formed over another substrate. That is, the whole circuit shown in FIG. 16 or 17 is not necessarily required to be formed over one substrate. For example, the following is possible in the circuits shown in FIGS. 16 and 17, the pixel array 1601 and the gate line driver circuit 1602 are formed over a glass substrate by using TFTs while the signal line driver circuit 1610 (or a part thereof) is formed over a monocrystalline substrate, and the IC chip is provided on the glass substrate by connecting by COG (Chip On Glass), or the IC chip is connected to the glass substrate by using TAB (Tape Automated Bonding) or a printed circuit board.

It is to be noted that the invention is applied to a display device in this embodiment mode, however, it is not limited to this. The invention can be applied to the case where a circuit for outputting a signal for selecting sequentially is required. Therefore, the invention can be applied to a storage device such as a memory, including a mask ROM, a DRAM, an SRAM, and a nonvolatile memory such as a flash memory. In addition, the invention can be applied to an image sensor provided with a photoelectric converter, including various types of image sensors such as a CMOS sensor and a CCD sensor.

Note that description is made in this embodiment mode by referring the description in Embodiment Mode 1. Therefore, the description of Embodiment Mode 1 can be applied to this embodiment mode.

Embodiment Mode 3

Figure 22:
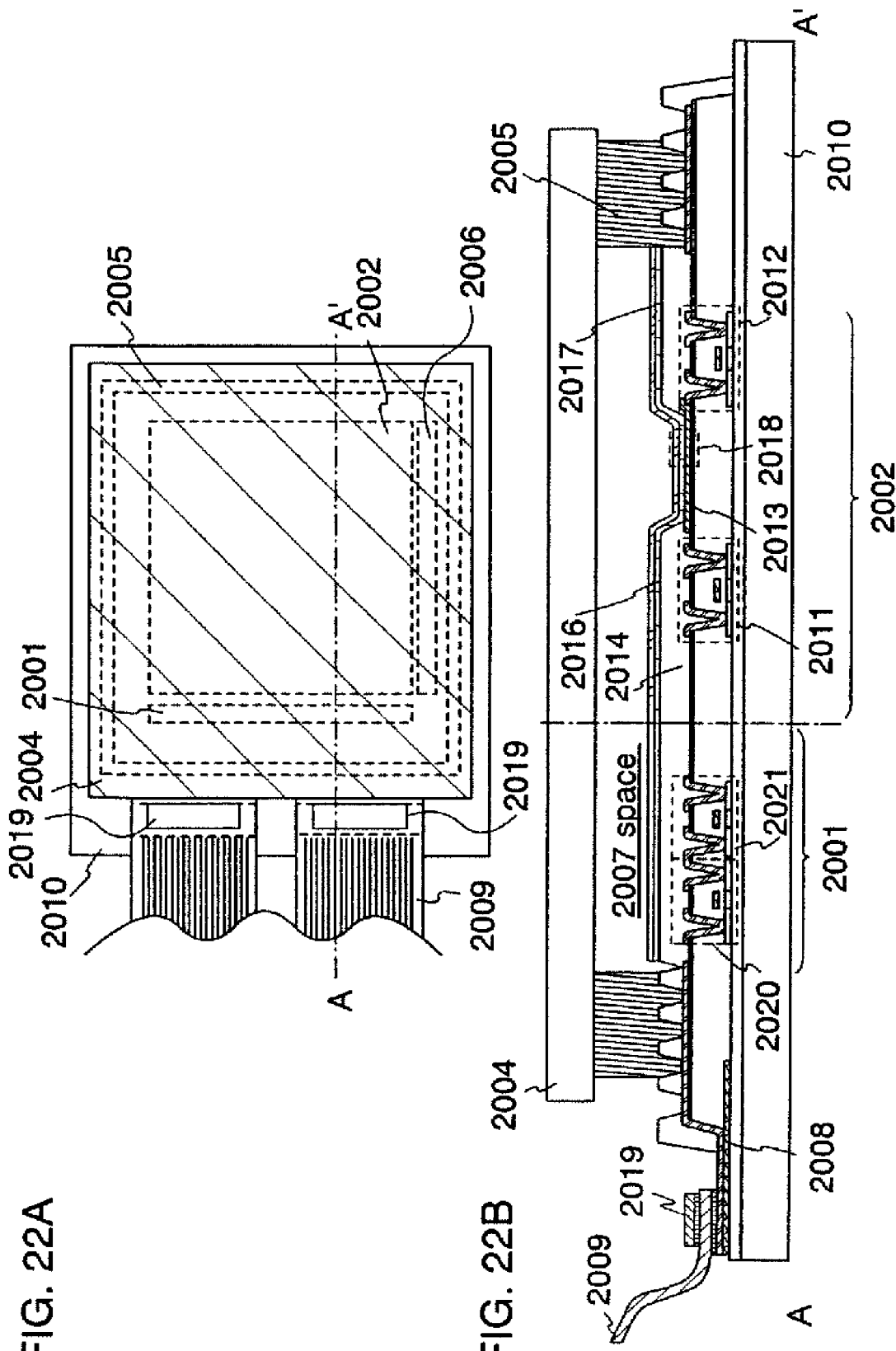
FIGS. 22A and 22B are views describing a structure of a display panel to which the invention is applied.

Described in this embodiment mode with reference to FIGS. 22A and 22B is a structure of a display panel comprising the shift register described in Embodiment Mode 1.

FIG. 22A is a top view of a display panel and FIG. 22B is a cross-sectional view of FIG. 22A taken along a line A-A'. A signal line driver circuit 2001, a pixel portion 2002, and a scan line driver circuit 2006 are included, which are shown by a dotted line. In addition, a sealing substrate 2004, a sealant 2005, and a space 2007 surrounded by the sealant 2005 are included. The shift register of the invention is provided in the signal line driver circuit 2001 and the scan line driver circuit 2006.

A wiring 2008 is for transmitting signals to be inputted to the scan line driver circuit 2006 and the signal line driver circuit 2001, and receives a video signal, a clock signal, a start signal, and the like from an FPC (Flexible Printed Circuit) 2009. An IC chip (a semiconductor chip provided with a memory circuit, a buffer circuit, and the like) 2019 is mounted onto the connection portion between the FPC 2009 and the display panel by COG (Chip On Glass) or the like. Note that only the FPC is illustrated in the drawing, however, a printed wiring board (PWB) may be attached to the FPC.

Next, a cross-sectional structure thereof is described using FIG. 22B. The pixel portion 2002 and the peripheral driver circuitry (the scan line driver circuit 2006 and the signal line driver circuit 2001) are formed over a substrate 2010. The signal line driver circuit 2001 and the pixel portion 2002 are illustrated in the drawing here.

It is to be noted that, in the signal line driver circuit 2001, a CMOS may be structured by a P-channel TFT 2020 and an N-channel TFT 2021. In the display panel described in this embodiment mode, the peripheral driver circuitry is formed over one substrate. However, the invention is not limited to this, and the whole or a part of the peripheral driver circuitry may be formed as an IC chip and mounted by COG or the like.

The pixel portion 2002 comprises a plurality of pixel circuits each having a switching TFT 2011 and a driving TFT 2012. The source electrode or the drain electrode of the driving TFT 2012 is connected to a first electrode 2013. Then, an insulator 2014 is formed so as to cover the end portion of the first electrode 2013, which is formed by using a positive type photosensitive acrylic resin film here.

To improve the coverage of an electrode and a light emitting layer containing an organic compound that are formed in the following step, the insulator 2014 is formed so that the upper edge portion or the bottom edge portion has a curved surface having curvature. For example, in the case where a positive type photosensitive acrylic is used as a material for the insulator 2014, it is preferable that only the upper edge portion of the insulator 2014 have a curved surface having radius of curvature (from 0.2 μm to 3 μm). Either a photosensitive negative type resin that becomes insoluble in etchant by light or a photosensitive positive type resin that becomes dissoluble in etchant by light can be used as the insulator 2014.

Over the first electrode 2013, a layer containing an organic compound (an electroluminescent layer) 2016 and a second electrode 2017 are formed. The first electrode 2013 that functions as an anode is preferably formed using a material having a high work function. For example, a single-layer film such as an ITO (indium tin oxide) film, an indium zinc oxide (IZO) film, a titanium nitride film, a chromium film, a tungsten film, a Zn film, or a Pt film, a laminated layer of a titanium nitride film and a film containing aluminum as a main component, or a three-layer structure of a titanium nitride film, a film containing aluminum as a main component and a titanium nitride film can be employed. It is to be noted that a laminated structure makes it possible to reduce the resistance as a wiring and realize a good ohmic contact.

The layer containing an organic compound 2016 is formed by vapor deposition using an evaporation mask or ink jetting. As the layer containing an organic compound 2016, a metal complex of the fourth group of the periodic system is partially employed, and either a low molecular weight material or a high molecular weight material can be employed in combination with such a metal complex. Generally, an organic compound is used as a single layer or a laminated layer in many cases as a material for the layer containing an organic compound 2016, however, the structure in which an inorganic compound is used partially in a film formed by an organic compound is included in this embodiment mode. Moreover, a known triplet material can be employed as well.

As a material for the second electrode (a cathode) 2017 formed on the layer containing an organic compound 2016, a material having a small work function (Al, Ag, Li, Ca, or an alloy of these elements such as MgAg, MgIn, AlLi, CaF2, or CaN) can be employed. In the case where light generated in the electroluminescent layer 2016 is emitted through the second electrode 2017, a laminated layer of a metal thin film which is formed to be thin, and a transparent conductive film (e.g., ITO (indium tin oxide), an alloy of indium oxide and zinc oxide ($In_2O_3$—ZnO), and zinc oxide (ZnO)) is preferably used as the second electrode (a cathode) 2017.

Subsequently, the sealing substrate 2004 is bonded to the substrate 2010 with the sealant 2005, which completes such a structure that a light emitting element 2018 is provided in the space 2007 surrounded by the substrate 2010, the sealing substrate 2004, and the sealant 2005. The space 2007 is filled with an inert gas (e.g., nitride or argon) or the sealant 2005.

It is to be noted that an epoxy resin is preferably employed for the sealant 2005. In addition, it is desirable that the material transmits moisture and oxygen as less as possible. As the sealing substrate 2004, a glass substrate, a quartz substrate, a plastic substrate formed of FRP (Fiberglass-Reinforced Plastics), PVF (polyvinyl fluoride), Myler, polyester, acrylic, or the like can be used.

In this manner, a display panel comprising a shift resistor of the invention can be formed.

The present invention is applied to a shift register provided in the signal fine driver circuit 2001 and the scan line driver circuit 2006 of the display panel shown in FIGS. 22A and 22B, thereby the dullness of the waveform of the clock signal is suppressed, and normal operation of a circuit can be obtained. In addition, power consumption can be reduced. Furthermore, since the constitution is simple, layout area of the circuit is reduced and the frame size can be reduced.

Figure 23:
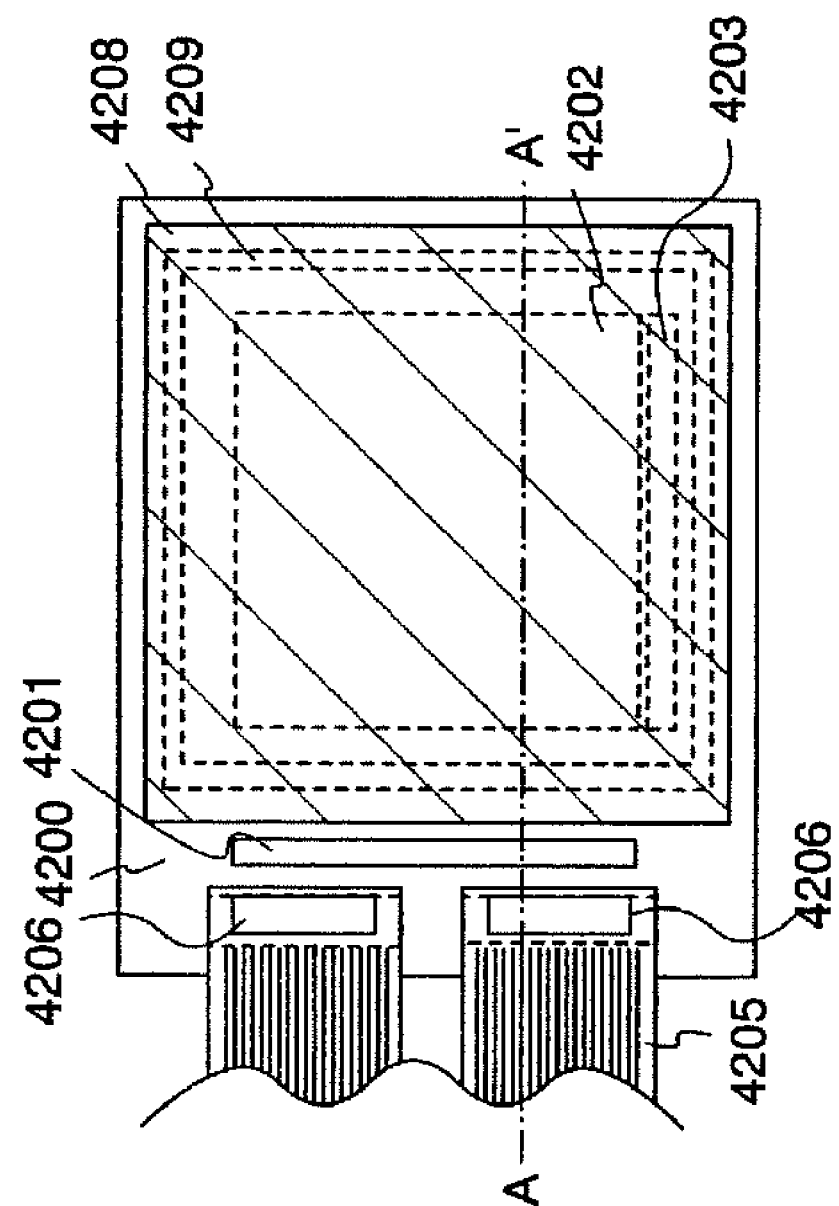
FIG. 23 is a view describing a structure of a display panel to which the invention is applied.

It is to be noted that constitution of the display panel is not limited to the constitution shown in FIG. 22A where the signal line driver circuit 2001, the pixel portion 2002, and the scan line driver circuit 2006 are integrally comprised, but the constitution where a signal line driver circuit 4201 shown in FIG. 23 is formed on an IC chip as the signal line driver circuit 2001 and mounted on the display panel by COG and the like may be employed. Note that a substrate 4200, a pixel portion 4202, a scan line driver circuit 4203, an FPC 4205, an IC chip 4206, a sealing substrate 4208, and a sealant 4209 in FIG. 23 correspond to the substrate 2010, the pixel portion 2002, the scan line driver circuit 2006, the FPC 2009, the IC chip 2019, the sealing substrate 2004, and the sealant 2005 in FIG. 22A respectively.

That is, only a signal line driver circuit whose driver circuit is required to operate rapidly may be formed using a CMOS and the like on an IC chip. By employing the shift register of the invention in the signal line driver circuit, the pixel portion can be operated normally and power consumption can be reduced. Moreover, when the IC chip is a semiconductor chip such as a silicon wafer, high-speed operation and low power consumption can be further achieved.

Embodiment Mode 4

Electronic apparatuses employing the invention include a video camera, a digital camera, a goggle-type display, a navigation system, a sound reproduction apparatus (e.g., a car audio system and an audio component system), a personal computer, a game machine, a portable information terminal (e.g., a mobile computer, a mobile telephone, a portable game machine, and an electronic book), an image reproduction apparatus comprising a recording medium (specifically, an apparatus which can reproduce a recording medium such as a digital versatile disc (DVD), and comprises a display for displaying it). Specific examples thereof are illustrated in FIGS. 18A to 18H.

Figure 18A:
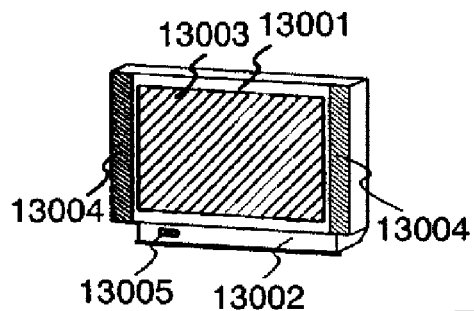
FIGS. 18A to 18H are views of electronic apparatuses each to which the invention is applied.

FIG. 18A illustrates a light emitting device which includes a housing 13001, a supporting base 13002, a display portion 13003, a speaker portion 13004, and a video input terminal 13005. The invention can be applied to a semiconductor device constituting the display portion 13003. The light emitting device illustrated in FIG. 18A is completed by the invention. Since the light emitting device is of a self-luminous type, no backlight is required and a display portion can be thinner than that of liquid crystal displays. Note that the display device includes any display device for displaying information such as for computer, for TV broadcast reception, for advertisement display and the like.

By employing the invention, the light emitting device can be operated normally, power consumption can be reduced, and the size and cost of the device can be reduced, for example.

Figure 18B:
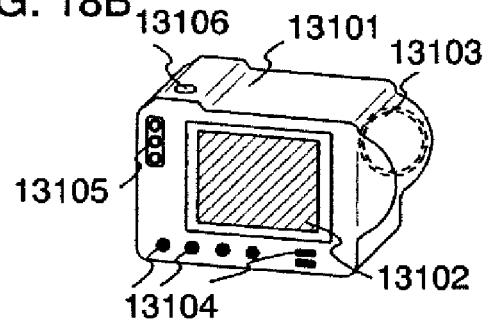

FIG. 18B illustrates a digital still camera which includes a main body 13101, a display portion 13102, an image receiving portion 13103, operating keys 13104, an external connection port 13105, and a shutter 13106. The invention can be applied to a semiconductor device constituting the display portion 13102. The digital still camera illustrated in FIG. 18B is completed by the invention.

By employing the invention, the display portion can be operated normally, power consumption can be reduced, and the size and cost of the device can be reduced, for example.

Figure 18C:
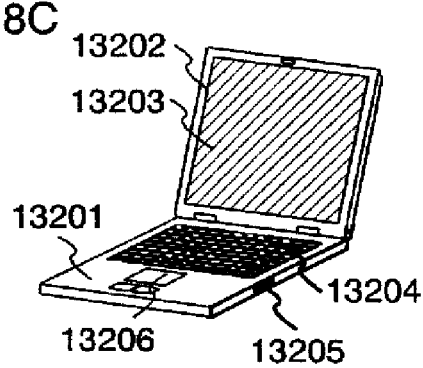

FIG. 18C illustrates a notebook computer which includes a main body 13201, a housing 13202, a display portion 13203, a keyboard 13204, an external connection port 13205, and a pointing mouse 13206. The invention can be applied to a semiconductor device constituting the display portion 13203. The light emitting device illustrated in FIG. 18C is completed by the invention.

By employing the invention, the light emitting device can be operated normally, power consumption can be reduced, and the size and cost of the device can be reduced, for example.

Figure 18D:
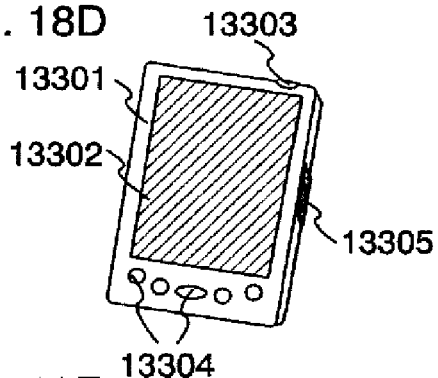

FIG. 18D illustrates a mobile computer which includes a main body 13301, a display portion 13302, a switch 13303, operating keys 13304, and an infrared port 13305. The invention can be applied to a semiconductor device constituting the display portion 13302. The mobile computer illustrated in FIG. 18D is completed by the invention.

By employing the invention, the display portion can be operated normally, power consumption can be reduced, and the size and cost of the device can be reduced, for example.

Figure 18E:
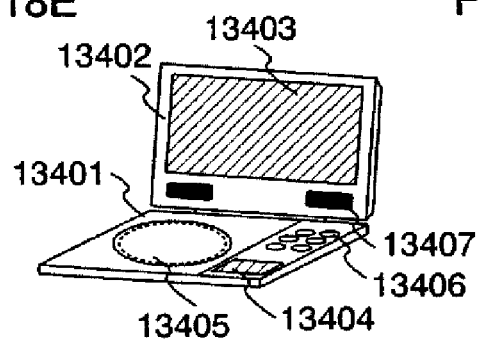

FIG. 18E illustrates a portable image reproduction apparatus comprising a recording medium (specifically, a DVD reproduction apparatus), which includes a main body 13401, a housing 13402, a display portion A 13403, a display portion B 13404, a recording medium (e.g., DVD) reading portion 13405, an operating key 13406, and a speaker portion 13407. The display portion A 13403 is used mainly for displaying image information, while the display portion B 13404 is used mainly for displaying character information. The invention can be applied to semiconductor devices constituting the display portions A 13403 and B 13404. The image reproduction apparatus comprising a recording medium further includes a home game machine or the like. The DVD reproduction apparatus illustrated in FIG. 18E is completed by the invention.

By employing the invention, the display portion can be operated normally, power consumption can be reduced, and the size and cost of the device can be reduced, for example.

Figure 18F:
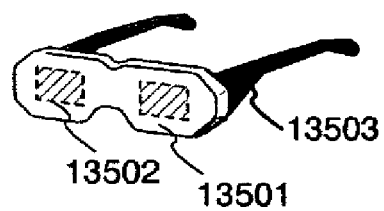

FIG. 18F illustrates a goggle-type display (head mounted display) which includes a main body 13501, a display portion 13502, and an arm portion 13503. The invention can be applied to a semiconductor device constituting the display portion 13502. The goggle-type display illustrated in FIG. 18F is completed by the invention.

By employing the invention, the display portion can be operated normally, power consumption can be reduced, and the size and cost of the device can be reduced, for example.

Figure 18G:
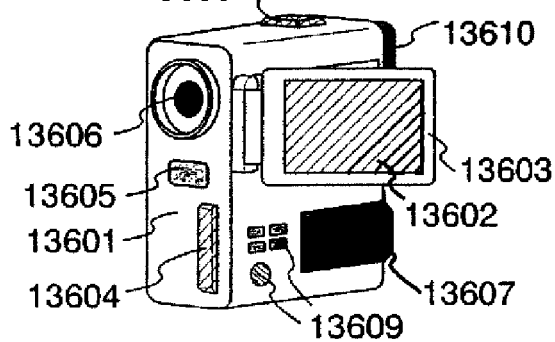

FIG. 18G illustrates a video camera which includes a main body 13601, a display portion 13602, a housing 13603, an external connection port 13604, a remote control receiving portion 13605, an image receiving portion 13606, a battery 13607, a sound input portion 13608, and operating keys 13609, and an eye piece 13610. The invention can be applied to a semiconductor device constituting the display portion 13602. The video camera illustrated in FIG. 18G is completed by the invention.

By employing the invention, the display portion can be operated normally, power consumption can be reduced, and the size and cost of the device can be reduced, for example.

Figure 18H:
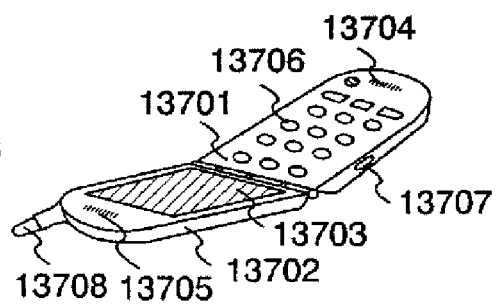
Figure 19:
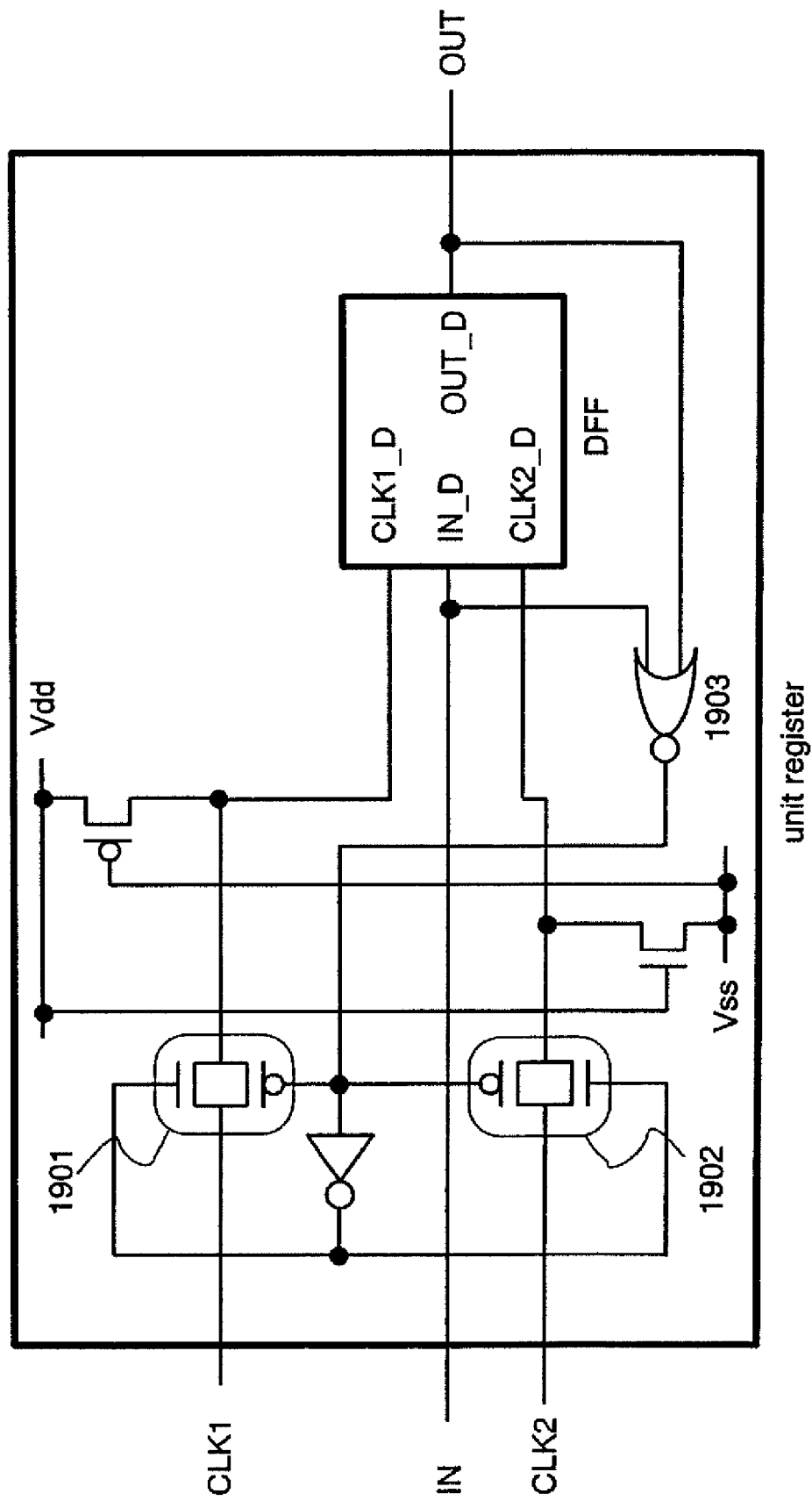
FIG. 19 is a diagram describing constitution of a conventional semiconductor device.
Figure 20:
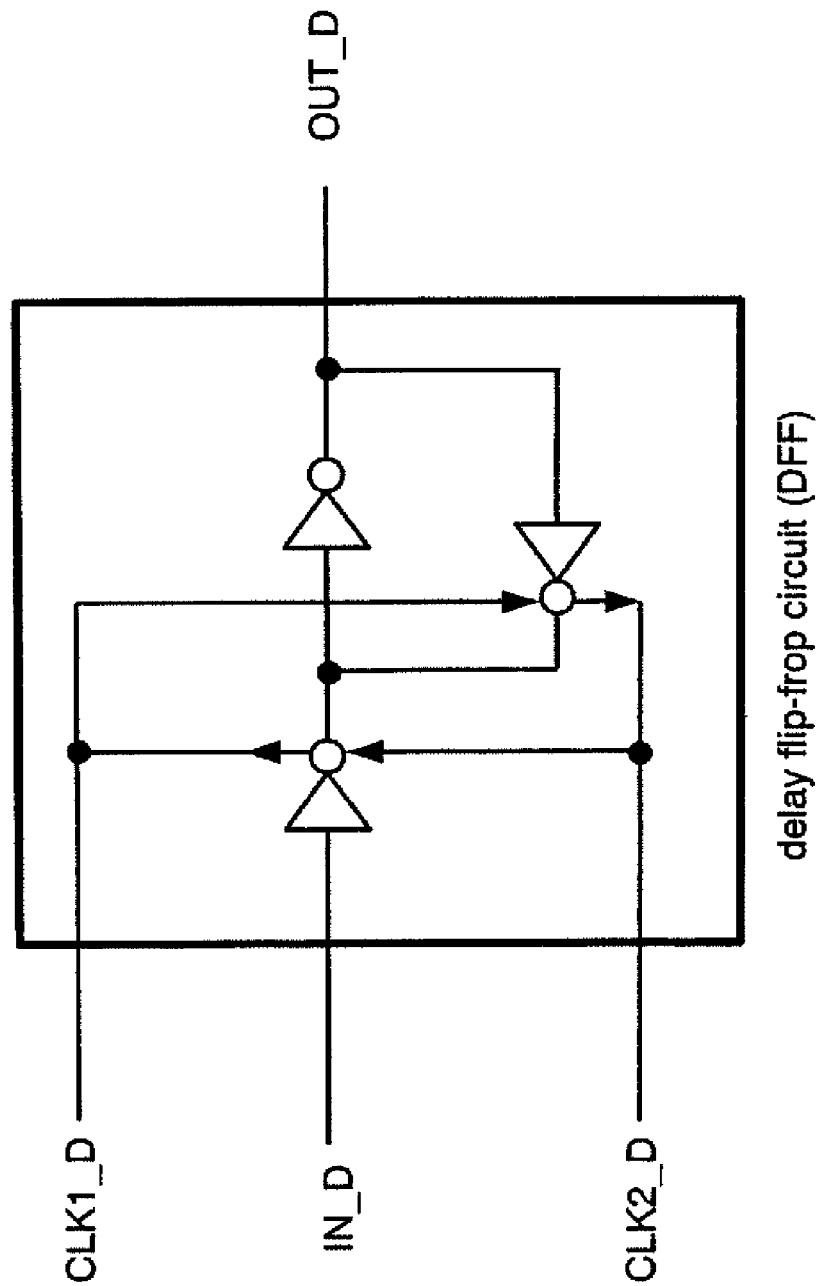
FIG. 20 is a diagram describing constitution of a conventional semiconductor device.
Figure 21:
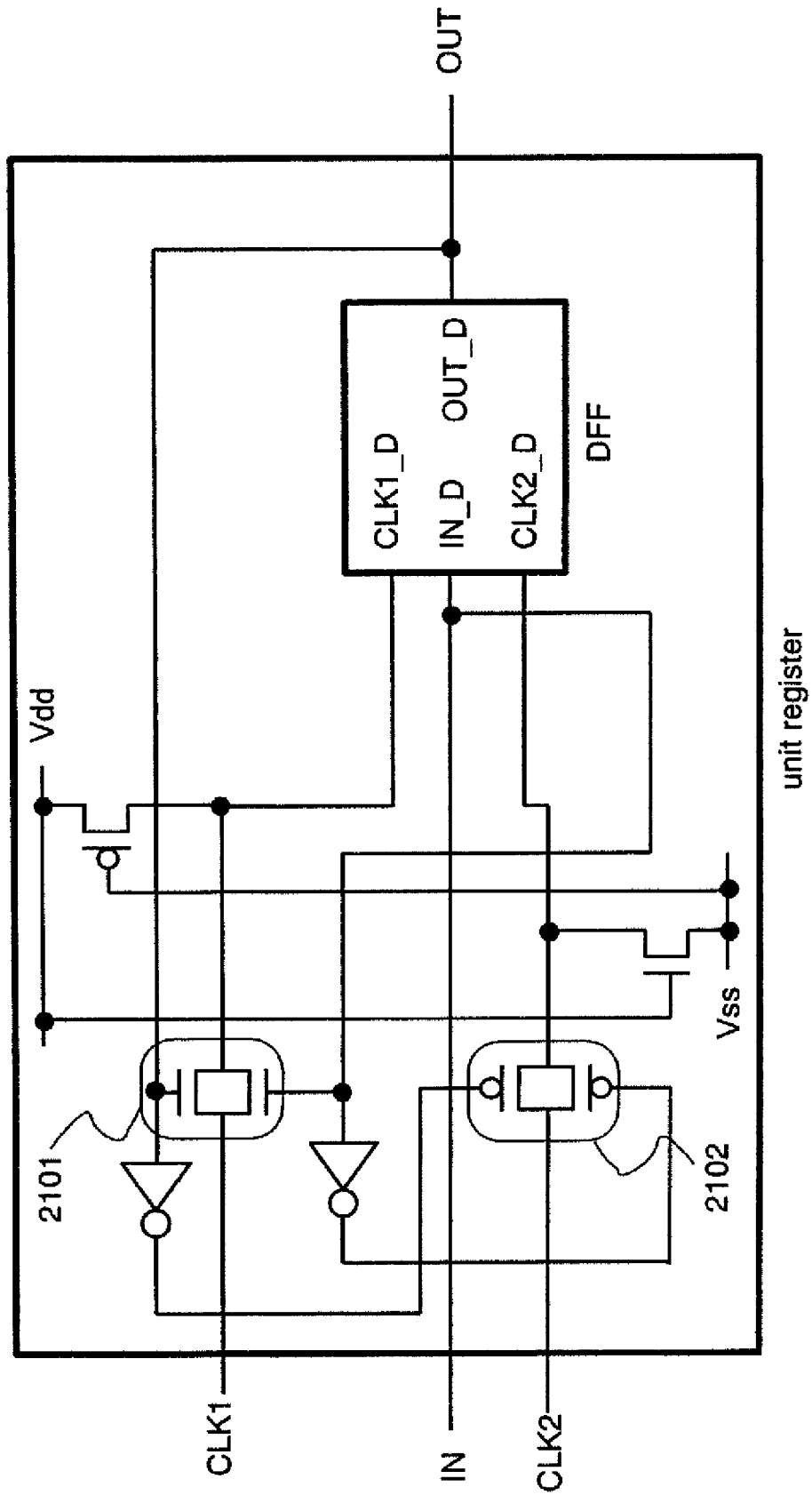
FIG. 21 is a diagram describing constitution of a conventional semiconductor device.

FIG. 18H illustrates a mobile telephone which includes a main body 13701, a housing 13702, a display portion 13703, a sound input portion 13704, a sound output portion 13705, an operating key 13706, an external connection port 13707, and an antenna 13708. The invention can be applied to a semiconductor device constituting the display portion 13703. The mobile telephone illustrated in FIG. 18H is completed by the invention.

By employing the invention, the display portion can be operated normally, power consumption can be reduced, and the size and cost of the device can be reduced, for example.

When the luminance of a light emitting material is increased in the future, outputted light containing image information can be magnified and projected by a lens and the like for a front projector or a rear projector.

In addition, the above-described electronic apparatuses have displayed information distributed through an electronic communication line such as the Internet and a CATV (cable television) increasingly. In particular, an opportunity for displaying moving image information is increasing. A light emitting device is suitable for displaying a moving image since a light emitting material exhibits fast response.

In a light emitting device, it is preferable to display information so as to reduce a light emitting part which consumes power as much as possible. Therefore, in the case where the light emitting device is applied to a display portion of a portable information terminal, in particular, of a mobile telephone, a sound reproduction apparatus or the like which mainly displays character information, it is preferable to drive so as to form the character information by means of a light emitting part with a non-light emitting part as a background.

As described above, application range of the invention is quite wide, and the invention can be employed in electronic apparatuses of various fields. In addition, the electronic apparatuses described in this embodiment mode can employ the semiconductor devices of either constitution described in Embodiment Mode 1 or 2.

This application is based on Japanese Patent Application serial no. 2004-151722 filed in Japan Patent Office on May 21, 2004, the entire contents of which are hereby incorporated by reference.

What is claimed is:

1. A semiconductor device comprising:
a circuit including a first flip-flop;
a first transistor;
a second transistor;
a first wiring to which a first clock signal is inputted; and
a second wiring to which a second clock signal is inputted,
wherein the first wiring is electrically connected to the first flip-flop through a source and a drain of the first transistor,
wherein the second wiring is electrically connected to the first flip-flop through a source and a drain of the second transistor,
wherein the first transistor is controlled by an output signal from the first flip-flop, and
wherein the second transistor is controlled by an input signal to the first flip-flop.

2. A semiconductor device according to claim 1, further comprising a third transistor, wherein the first transistor and the third transistor constitute a complementary transfer gate.

3. A semiconductor device according to claim 1, further comprising a third transistor, wherein the second transistor and the third transistor constitute a complementary transfer gate.

4. A semiconductor device according to claim 1, wherein the first flip-flop is a first shift register and the circuit includes multiple shift registers.

5. A semiconductor device according to claim 1, wherein the first flip-flop is a delay flip-flop.

6. A display device including the semiconductor device according to claim 1.

7. An electronic device including the display device according to claim 6.

8. A semiconductor device comprising: a circuit including a first flip-flop;
a first transistor;
a second transistor;
a first wiring to which a first clock signal is inputted; and
a second wiring to which a second clock signal is inputted,
wherein the first wiring is electrically connected to the first flip-flop through a source and a drain of the first transistor,
wherein the second wiring is electrically connected to the first flip-flop through a source and a drain of the second transistor,
wherein a gate of the first transistor is electrically connected to an output of the first flip-flop, and
wherein a gate of the second transistor is electrically connected to an input of the first flip-flop.

9. A semiconductor device according to claim 8, further comprising a third transistor, wherein the first transistor and the third transistor constitute a complementary transfer gate.

10. A semiconductor device according to claim 8, further comprising a third transistor, wherein the second transistor and the third transistor constitute a complementary transfer gate.

11. A semiconductor device according to claim 8, wherein the first flip-flop is a first shift register and the circuit includes multiple shift registers.

12. A semiconductor device according to claim 8, wherein the first flip-flop is a delay flip-flop.

13. A display device including the semiconductor device according to claim 8.

14. An electronic device including the display device according to claim 13.

15. A semiconductor device comprising: a circuit including a first flip-flop;
   a first transistor;
   a second transistor,
   a first wiring to which a first clock signal is inputted; and
   a second wiring to which a second clock signal is inputted,
   wherein the first wiring is electrically connected to one of a source and a drain of the first transistor, and the other of the source and the drain of the first transistor is electrically connected to the first flip-flop,
   wherein the second wiring is electrically connected to one of a source and a drain of the second transistor, and the other of the source and the drain of the second transistor is electrically connected to the first flip-flop,
   wherein a gate of the first transistor is electrically connected to an output of the first flip-flop, and
   wherein a gate of the second transistor is electrically connected to an input of the first flip-flop.

16. A semiconductor device according to claim 15, further comprising a third transistor, wherein the first transistor and the third transistor constitute a complementary transfer gate.

17. A semiconductor device according to claim 15, further comprising a third transistor, wherein the second transistor and the third transistor constitute a complementary transfer gate.

18. A semiconductor device according to claim 15, wherein the first flip-flop is a first shift register and the circuit includes multiple shift registers.

19. A semiconductor device according to claim 15, wherein the first flip-flop is a delay flip-flop.

20. A display device including the semiconductor device according to claim 15.

21. An electronic device including the display device according to claim 20.

* * * * *